United States Patent
Doyle et al.

(10) Patent No.: US 6,870,410 B1
(45) Date of Patent: Mar. 22, 2005

(54) ALL DIGITAL POWER SUPPLY SYSTEM AND METHOD THAT PROVIDES A SUBSTANTIALLY CONSTANT SUPPLY VOLTAGE OVER CHANGES IN PVT WITHOUT A BAND GAP REFERENCE VOLTAGE

(75) Inventors: James Thomas Doyle, Nederland, CO (US); Dae Woon Kang, Franklin, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 35 days.

(21) Appl. No.: 10/272,027

(22) Filed: Oct. 15, 2002

(51) Int. Cl.$^7$ .............................. H03L 7/00; H04L 25/00
(52) U.S. Cl. ........................ 327/149; 327/152; 375/371; 375/373
(58) Field of Search ............................... 363/37–39, 40, 363/41, 34, 20, 21.11, 53, 71, 80, 89; 327/538, 536, 365, 376, 377, 387, 151, 152, 149, 150, 540, 231, 277; 375/149, 371, 372, 373, 376

(56) References Cited

U.S. PATENT DOCUMENTS

| 5,602,882 | A | 2/1997 | Co et al. ..................... 375/372 |
| 6,262,611 | B1 | 7/2001 | Takeuchi .................... 327/159 |
| 6,317,008 | B1 * | 11/2001 | Gabara .................... 331/117 R |
| 6,351,165 | B1 | 2/2002 | Gregorian et al. .......... 327/156 |
| 6,498,512 | B2 * | 12/2002 | Simon et al. .................. 326/93 |

OTHER PUBLICATIONS

Dragan Maksimovic, Bruno Kranzen, Sandeep Dhar and Ravindra Ambatipudi, U.S. patent application Ser. No. 10/053,226, filed Jan. 19, 2002, entitled "An Adaptive Voltage Scaling Digital Processing Component and Method of Operating the Same".

Bruno Kranzen and Dragan Maksimovic, U.S. patent application Ser. No. 10/053,227, filed Jan. 19, 2002, entitled "Adaptive Voltage Scaling Clock Generator for Use in a Digital Processing Component and Method of Operating the Same".

Dragan Maksimovic and Sandeep Dhar, U.S. patent application Ser. No. 10/053,828, filed Jan. 19, 2002, entitled "System for Adjusting a Power Supply Level of a Digital Processing Component and Method of Operating the Same".

Dragan Maksimovic, Ravindra Ambatipudi, Sandeep Dhar and Bruno Krazen, U.S. patent application Ser. No. 10/053, 228, filed Jan. 19, 2002, entitled "An Adaptive Voltage Scaling Power Supply for Use in a Digital Processing Component and Method of Operating the Same".

(List continued on next page.)

*Primary Examiner*—Rajnikant B Patel
(74) *Attorney, Agent, or Firm*—Mark C. Pickering

(57) ABSTRACT

An all digital power supply system provides a supply voltage to semiconductor circuits. The power supply system utilizes an up/down counter and a pulse width modulator to output a signal into a LC network that generates the supply voltage. The width of the pulses output by the pulse width modulator are defined by an encoder that generates width information in response to a propagation delay detector that measures the propagation delay of a first clock signal when clocked by a second clock signal. The system supplies the optimum or minimum required voltage to insure that a critical path through a digital chip is met over process, voltage, and temperature (PVT) variations without the use of a band gap reference voltage source. A state machine is also used to counteract oscillations introduced by start up and load transients, thereby eliminating the need for a proportional integrator differentiator (PID).

28 Claims, 19 Drawing Sheets

OTHER PUBLICATIONS

James T. Doyle and Dragan Maksimovic, U.S. patent application Ser. No. 10/160,428, filed Mar. 26, 2002, entitled "Method and System for Minimizing Power Consumption in Mobile Devices Using Cooperative Adaptive Voltage and Threshold Scaling".

Dragan Maksimovic and James Thomas Doyle, U.S. patent application Ser. No. 10/166,822, filed Jun. 10, 2002, entitled "Serial Digital Communication Superimposed on a Digital Signal Over a Single Wire".

Dragan Maksimovic and Sandeep Dhar, U.S. patent application Ser. No. 10/236,482, filed Sep. 6, 2002, entitled "Method and System for Providing Self–Calibration for Adaptively Adjusting a Power Supply Voltage in a Digital Processing System".

Mark F. Rives, U.S. patent application Ser. No. 10/246,971, filed Sep. 19, 2002, entitled "Power Supply System and Method that Utilizes an Open Loop Power Supply Control".

Jim Doyle and Bill Broach, Small Gains in Power Efficiency Now, Bigger Gains Tomorrow [online]. Jul. 9, 2002 [retrieved on Feb. 1, 2003]. Retrieved from the Internet: <URL: http://www.commsdesign.com/design corner/OEG20020709S0022>. pp. 1–5.

Robert W. Erickson and Dragan Maksimovic, *Fundamentals of Power Electronics*. Second Edition, Kluwer Academic Publishers, 2001, pp. 333.

Krisztian Flautner, Steven Reinhardt and Trevor Mudge, Automatic Performance Setting for Dynamic Voltage Scaling, Wireless Networks, vol. 8, Issue 5, Sep. 2002, pp. 507–520, and Citation, pp. 1–3 [online]. [retrieved on Feb. 2, 2003]. Retrieved from the Internet: <URL: http://portal.acm.org/citation.cfm?id=582455.582463&coll=portal&dl=ACM&idx=J804&p. . .>.

Krisztian Flautner, Steven Reinhardt and Trevor Mudge, Automatic Performance Setting for Dynamic Voltage Scaling [online]. May 30, 2001, [retrieved on Feb. 2, 2003]. Retrieved from the Internet: <URL: http://www.eecs.umich.edu/~tnm/papers/mobicom01.pdf>. pp. 1–12.

Texas Instruments, "Synchronous–Buck PWM Controller With NMOS LDO Controller", TPS5110, SLVS025A–Apr. 2002, Revised Jun. 2002.

Intel XScale Core, Developer's Manual, Dec. 2000, [online]. [retrived on Feb. 2, 2003]. Retrieved from the Internet: <URL: http://developer.intel.com/design/intelxscale/27347301.pdf>. pp. 1–1 through B–1.

Kaushik Roy, Leakage Tolerant Circuits, Sub–Threshold Logic [online]. No date, [retrieved by inventor approximately Nov. 1, 2002]. Retrieved from the Interent:<URL:http://www.ece.purdue.edu/~vlsi/seven.pdf>. pp. 1–43.

Benjamin James Patella, "Implementation of a High Frequency, Low–Power Digital Pulse Width Modulation Controller Chip", Thesis Submitted To Graduate School of University of Colorado in Department of Electrical and Computer Engineering, 2000, pp. 1–272.

John G. Maneatis, "Low–Jitter Process–Independent DLL and PII Based on Self–Biased Techniques", ISCCC8.1 Presentation Slides, 3 sheets, IEEE Journal of Solid State Circuits, vol. 31, No. 11, Nov. 1996, pp. 1723–1732.

Sandeep Dhar, Dragan Maksimovic and Bruno Kranzen, "Closed–Loop Adaptive Voltage Scaling Controller for Standard–Cell ASICs," ISPED, Aug. 2002, pp. 103–107.

J. Goodman, A. Dancy and A. Chandrakasan, "An Energy/Security Scalable Encryption Processor Using an Embedded Variable Voltage DC/DC Converter", Journal of Solid State Circuits, vol. 33, No. 11, Nov. 1998, pp. 1799–1809.

Zhengyu Lu et al., "Reduction of Digital PWM Limit Ring with Novel Control Algorithm" IEEE Applied Power Electronics Conference 2001, vol. 1, 2001, pp. 521–525.

* cited by examiner

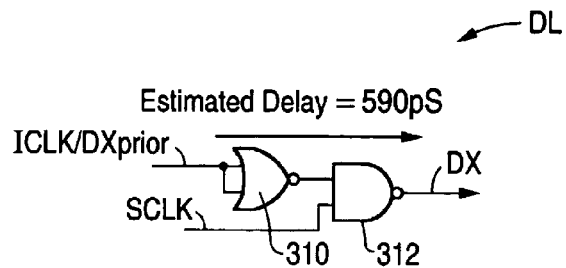
FIG. 3A
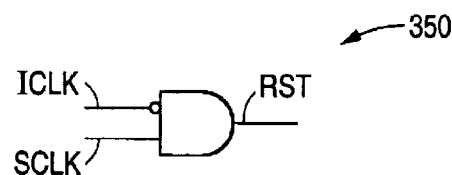
FIG. 3B
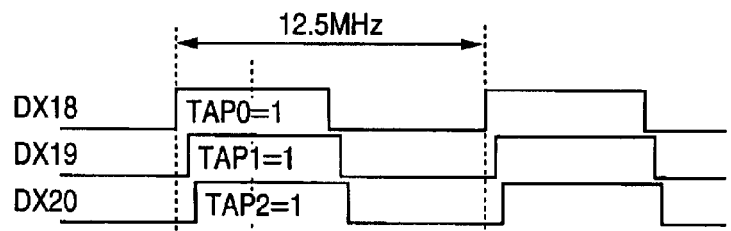
FIG. 4A DX18
FIG. 4B DX19
FIG. 4C DX20
FIG. 4D DX34
FIG. 4E DX48
FIG. 4F DX49
FIG. 4G DX50
FIG. 4H SCLK

FIG. 7A SCLK

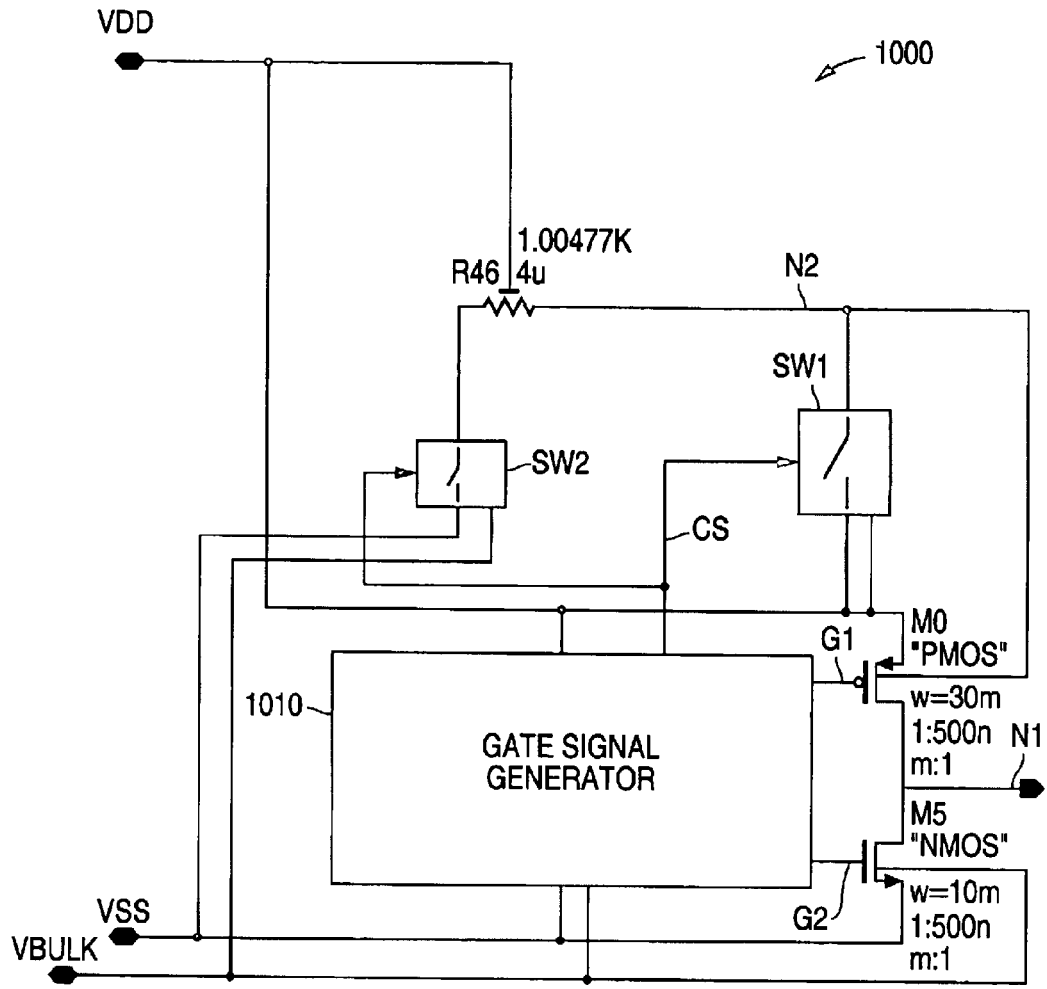
FIG. 10
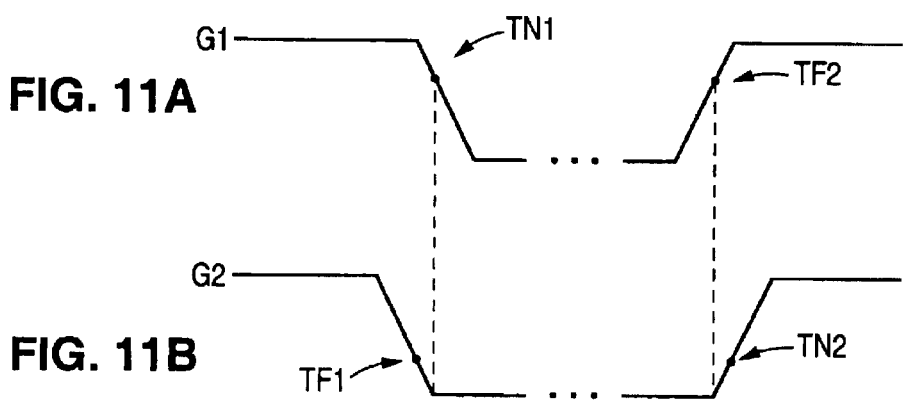
FIG. 11A
FIG. 11B

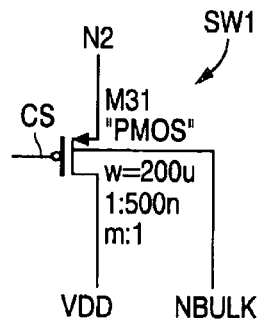
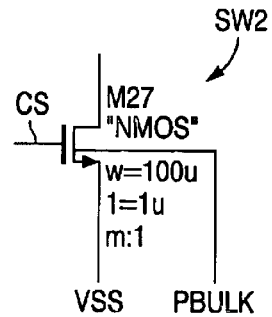
FIG. 13A  FIG. 13B
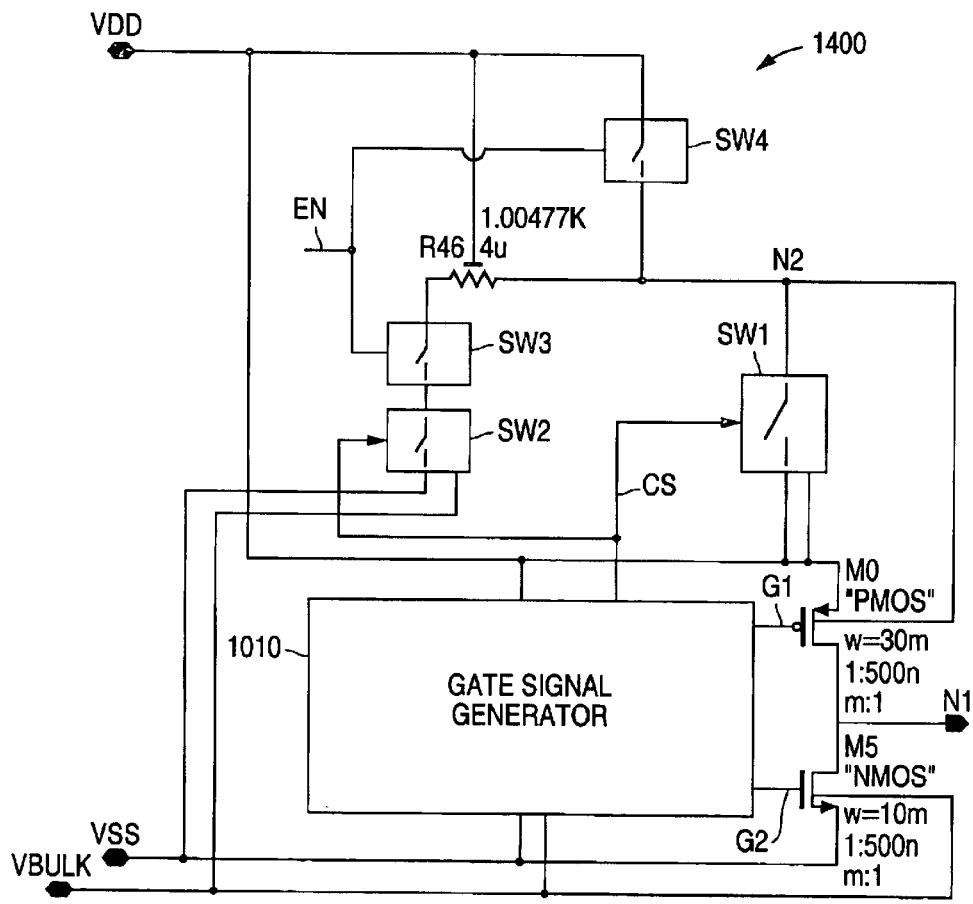
FIG. 14

ALL DIGITAL POWER SUPPLY SYSTEM AND METHOD THAT PROVIDES A SUBSTANTIALLY CONSTANT SUPPLY VOLTAGE OVER CHANGES IN PVT WITHOUT A BAND GAP REFERENCE VOLTAGE

RELATED APPLICATION

The present invention is related to application Ser. No. 10/272,035 for "Driver with Bulk Switching MOS Power Transistor" by James Thomas Doyle and Michael Angelo Tamburrino, and application Ser. No. 10/272,028 for "Level Translator for High Voltage Digital CMOS Process" by James Thomas Doyle, both filed on an even date herewith.

BACKGROUND OF THE INVENTION

1. Field of the Invention

The present invention relates to power supply systems and methods and, more particularly, to an all digital power supply system and method that provides a substantially constant supply voltage over changes in PVT without a band gap reference voltage.

2. Description of the Related Art

A DC-to-DC switching converter is a device that converts one DC voltage to another DC voltage with very little power loss. A boost converter is one type of DC-to-DC switching converter that receives an input voltage of one polarity, and outputs a voltage of the same polarity that is larger than the input voltage. A buck converter is another type of DC-to-DC switching converter that receives an input voltage of one polarity, and outputs a voltage of the same polarity that is smaller than the input voltage.

FIG. 1A shows a block diagram that illustrates a conventional buck converter 100. As shown in FIG. 1A, converter 100 has a power supply circuit 102 that receives a pulse width modulated signal PWS, and generates a supply voltage VDD in response to the pulse width modulated signal PWS.

Power supply circuit 102 includes a DC voltage source 110 and an n-channel MOS transistor 112 that has a source, a drain connected to voltage source 110, and a gate connected to receive the pulse width modulated signal PWS. Circuit 102 also includes a diode D that has an input connected to ground, and an output connected to the source of transistor 112.

In addition, power supply circuit 102 includes an inductor L and a capacitor C that form a LC network. Inductor L has a first end connected to the source of transistor 112, and a second end connected to a supply node NS, while capacitor C has a first end connected to the supply node NS, and a second end connected to ground. Further, a load 114 is connected between the supply node NS and ground.

In operation, the pulse width modulated signal PWS turns transistor 112 on and off, which outputs a pulsed current to the LC network. The LC network averages the pulsed current to generate the supply voltage VDD on the supply node NS. The supply voltage VDD has a value approximately equal to the duty cycle of the pulse width modulated signal PWS multiplied times the voltage of voltage source 110. For example, when a 50% duty cycle signal is used with a 2V-voltage source, a supply voltage VDD of approximately 1V results.

Diode D is used to provide a continuous conductive path for inductor L. When transistor 112 turns on, current is driven into inductor L, which stores the energy. When transistor 112 turns off, the stored energy is transferred to capacitor C as the voltage on the input of inductor L drops below ground. When the voltage on the input of inductor L drops below ground, diode D turns on, thereby providing a continuous conductive path.

Referring again to FIG. 1A, converter 100 also has a compensation circuit 116 that adjusts the duty cycle of the pulse width modulated signal PWS to maintain a roughly constant supply voltage VDD in response to changes in process, voltage, and temperature (PVT).

As shown, compensation circuit 116 includes an adjuster block 120 that divides down (or gains up) the supply voltage VDD on the supply node NS to output an adjusted voltage VA. In addition, circuit 116 includes an error block 122 that compares the adjusted voltage VA to a band gap reference voltage VBG to generate an error voltage VER.

Compensation circuit 116 further includes a proportional integrator differentiator (PID) 124 that responds to changes in the error voltage VER, and outputs a control voltage VC in response thereto, and a pulse width modulator 126 that outputs the pulse width modulated signal PWS.

The LC network is a two pole resonant system that stores energy. As a result, any transient introduced to the system, such as a start up transient or a load transient, causes a disturbance. The disturbance causes a response through the LC network that produces an oscillation or a ringing effect.

PID 124 eliminates the ringing effect by providing a zero that cancels one of the poles in the LC network. Canceling one of the poles, in turn, results in a first order system that is inherently stable. Thus, PID 124 converts the second order response of the LC network to a first order response.

Pulse width modulator 126 varies the positive widths (duty cycles) of the pulses in the pulse width modulated signal PWS in response to the control voltage VC output by PID 124. For example, a centered control voltage produces a pulse width modulated signal PWS with a 50% duty cycle. In addition, a driver block 128 drives the pulse width modulated signal PWS onto the gate of transistor 112.

In operation, the band gap reference voltage VBG is generated by a band gap circuit, and is roughly constant over changes in process, voltage, and temperature (PVT). Under normal operating conditions, the adjusted voltage VA and the band gap reference voltage VBG are equal and the error voltage VER is zero. A zero error voltage produces a control voltage VC which, in turn, produces a pulse width modulated signal PWS.

When the adjusted voltage VA varies due to changes in PVT, error block 122 outputs the error voltage VER with a non-zero value. PID 124 filters the error voltage VER to output a control voltage VC. Pulse width modulator 126 responds to the control voltage VC by varying the duty cycle of the pulse width modulated signal PWS which, in turn, changes the supply voltage VDD. This process continues until the adjusted voltage VA and the band gap reference voltage VBG are again equal.

Thus, compensation circuit 116 adjusts the duty cycle of the pulse width modulated signal PWS to maintain a roughly constant supply voltage VDD in response to changes in process, voltage, and temperature (PVT).

One drawback of switching converter 100 is that diode D introduces an undesirable resistance. One approach to reducing the resistance introduced by diode D is to use a synchronous rectifier. FIG. 1B shows a block diagram that illustrates a conventional synchronous rectifier 150.

As shown in FIG. 1B, synchronous rectifier 150 includes a PMOS driver transistor 152 that has a source connected to a supply voltage VDD, a drain connected to inductor L, and a gate. Rectifier 150 also has a NMOS driver transistor 154 that has a source connected to ground, a drain connected to an inductor node NL, and a gate.

As further shown in FIG. 1B, synchronous rectifier 150 also has a gate signal generator 156 that receives a pulse width modulated signal PWS, and outputs non-overlapping gate signals G1 and G2 to PMOS transistor 152 and NMOS transistor 154, respectively.

In operation, when the pulse width modulated signal PWS transitions low, generator 156 turns off NMOS transistor 154 via gate signal G2, and then turns on PMOS transistor 152 via gate signal G1. When PMOS transistor 152 turns on, transistor 152 sources current into inductor node NL.

When the pulse width modulated signal PWS transitions high, generator 156 turns off PMOS transistor 152 via gate signal G1, and then turns on NMOS transistor 154 via gate signal G2. When NMOS transistor 154 turns on, transistor 154 provides a path to ground to provide a continuous conductive path at the inductor node NL for an inductor.

Another drawback of switching converter 100 is that the converter requires a band gap reference voltage source to respond to changes in PVT. A band gap reference voltage source, however, is a complex circuit that provides only a roughly constant voltage over changes in PVT.

A further drawback of switching converter 100 is that the converter requires a PID, which is also a complex circuit, to compensate for the second order effects of the LC network. Thus, there is a need for a DC-to-DC switching converter that provides a substantially constant supply voltage over changes in PVT without a band gap reference voltage source and a PID.

SUMMARY OF THE INVENTION

The present invention provides an all digital power supply system and method that provides a substantially constant supply voltage over changes in process, voltage, and temperature (PVT) without a band gap reference voltage source and a proportional integrator differentiator (PID).

In accordance with the present invention, the power supply system includes a first clock generator that outputs an input clock signal and a sample clock signal, and a power node. The power supply system also includes a propagation delay detector connected to the power node that detects a propagation delay of the input clock signal as clocked by the sample clock signal. The propagation delay detector also outputs a multi-bit propagation delay word that identifies the propagation delay.

In addition, the power supply system includes a frequency detector connected to the propagation delay detector that receives the propagation delay word from the propagation detector, and generates a multi-bit encoded word that represents the propagation delay word. Further, a second clock generator outputs a load signal in response to a reference clock signal.

The power supply system also includes a counter that loads the encoded word in response to the load signal, changes a binary value of the encoded word as a count in response to the reference clock signal, and outputs the binary value of the count as a binary word. In addition, the power supply system includes a pulse width modulator connected to the counter that outputs a pulse modulated signal where a width of a pulse is defined by the binary value of the binary word output from the counter.

Further, the power supply system includes a level shifter and driver connected to the pulse width modulator that level shifts and drives the pulse modulated signal. This allows a lower voltage control signal to control the driver which is encountered in deep submicron digital processes. The power supply system additionally includes an LC filter connected to the level shifter and driver that generates a DC supply voltage on the power node in response to the pulse modulated signal.

The present invention also includes a method of providing power that includes the step of outputting an input clock signal and a sample clock signal. The method also includes the step of detecting a propagation delay of the input clock signal as clocked by the sample clock signal, and outputting a multi-bit propagation delay word that identifies the propagation delay.

In addition, the method includes the steps of generating a multi-bit encoded word that represents the propagation delay word in response to the propagation delay word, and outputting a load signal in response to a reference clock signal. The method further includes the step of loading the encoded word in response to a load signal, changing a binary value of the encoded word as a count in response to the reference clock signal, and outputting the binary value of the count as a binary word.

The method also includes the steps of outputting a pulse modulated signal where a width of a pulse is defined by the binary value of the binary word, and generating a DC supply voltage on a power node in response to the pulse modulated signal.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 3A is a circuit diagram illustrating an example of a delay block DL in accordance with the present invention.

FIG. 3B is a circuit diagram illustrating a reset circuit 350 in accordance with the present invention.

FIGS. 4A–4H are timing diagrams illustrating the operation of the sample clock signal SCLK in accordance with the present invention.

FIGS. 7A–7F are timing diagrams illustrating the operation of clock generator 218.

FIG. 10 is a block diagram illustrating an example of a driver stage 1000 in accordance with the present invention.

FIGS. 11A–11B are timing diagrams illustrating the operation of gate signal generator 1010 in accordance with the present invention.

FIGS. 13A and 13B are circuit diagrams illustrating examples of switches SW1 and SW2, respectively, in accordance with the present invention.

FIG. 14 is a circuit diagram illustrating an output stage 1400 in accordance with an alternate embodiment of the present invention.

FIG. 16A is a plan view, while FIG. 16B is a cross-sectional view taken along lines 16B—16B of FIG. 16A.

FIG. 17A is a plan view, while FIG. 17B is a cross-sectional view taken along lines 17B—17B of FIG. 17A.

DETAILED DESCRIPTION

Figure 1A:
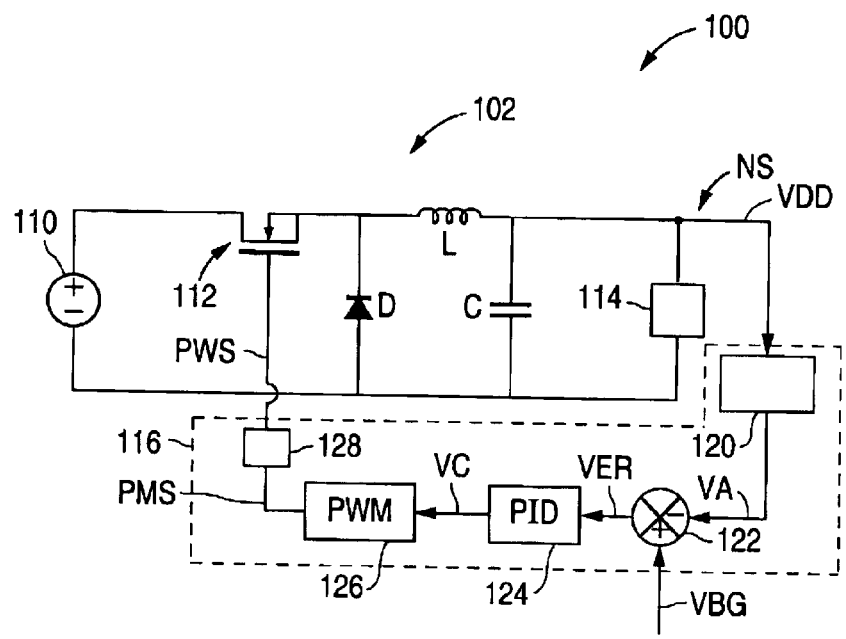
FIG. 1A is a block diagram illustrating a conventional buck converter 100.
Figure 1B:
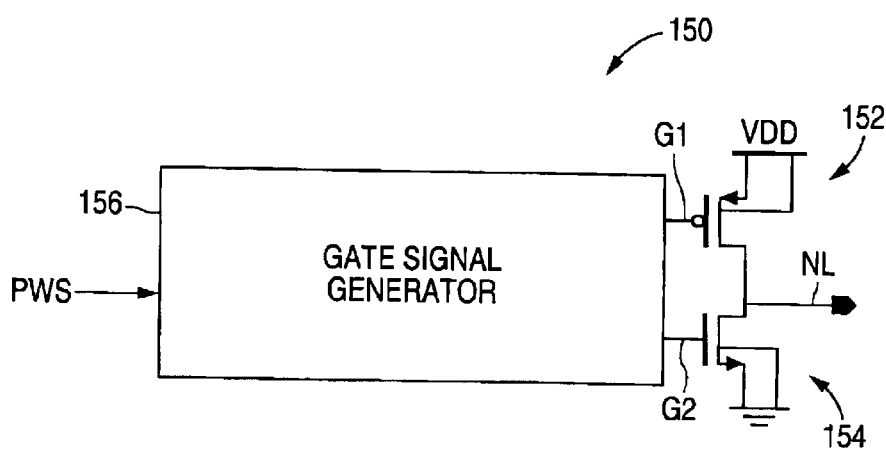
FIG. 1B is a block diagram illustrating a conventional synchronous rectifier 150.
Figure 2:
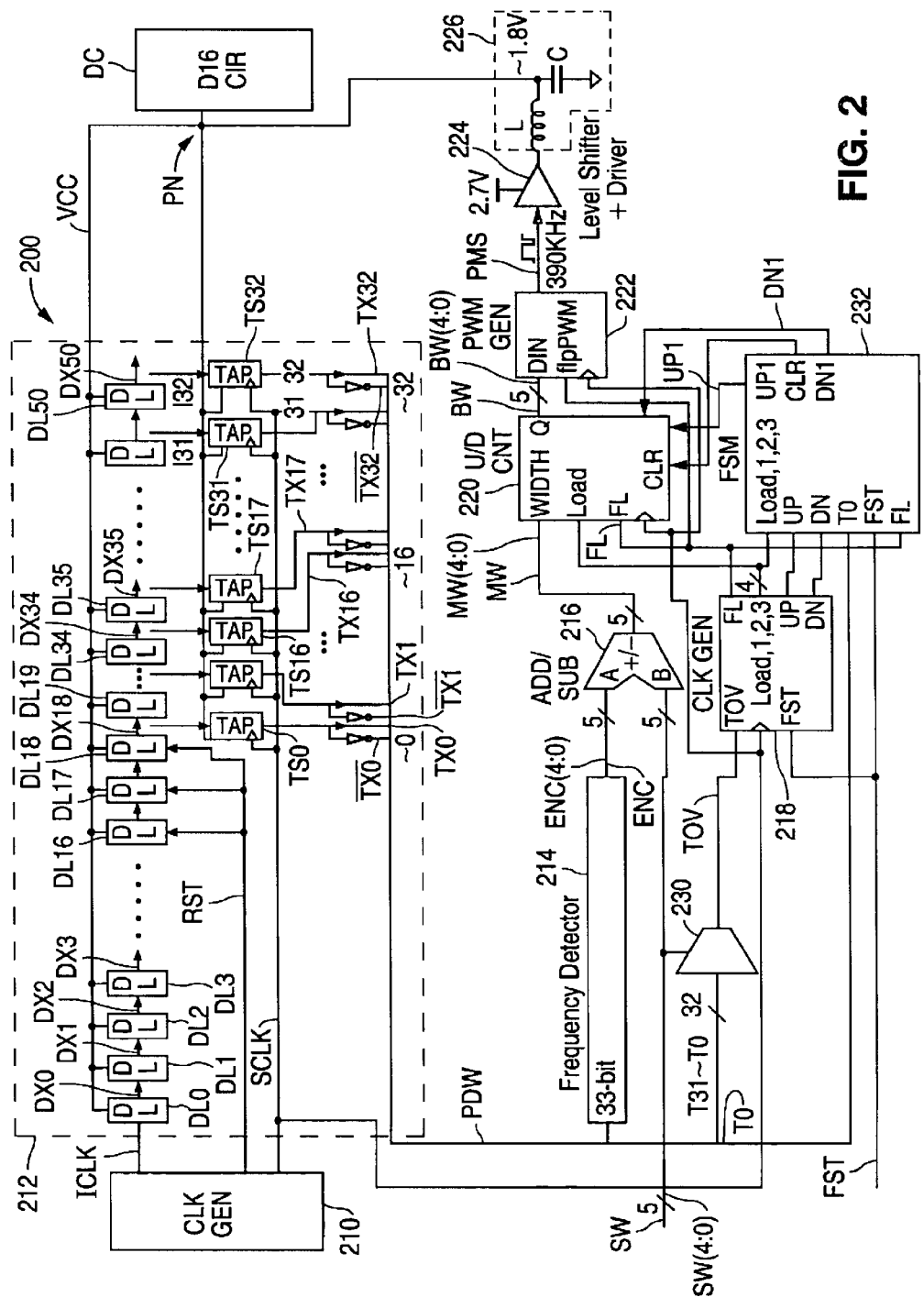
FIG. 2 is a circuit diagram illustrating an example of a power supply system 200 in accordance with the present invention.

FIG. 2 shows a circuit diagram that illustrates an example of a power supply system 200 in accordance with the present invention. As described in greater detail below, power supply system 200 is an all digital power supply system that provides a substantially constant supply voltage over changes in process, voltage, and temperature (PVT) without a band gap reference voltage source and a proportional integrator differentiator (PID).

Power supply system 200 includes a clock generator 210 that outputs an input clock signal ICLK and a sample clock signal SCLK. In the example shown in FIG. 2, the input and sample clock signals ICLK and SCLK are both 12.5 MHz signals. In addition, the sample clock signal SCLK is a quadrature signal with respect to the input clock signal ICLK (is delayed 90° with respect to the input clock signal ICLK).

Power supply system 200 also includes a propagation delay detector 212 that detects the propagation delay of the input clock signal ICLK as clocked by the sample clock signal SCLK, and outputs a multi-bit propagation delay word PDW that identifies the measured propagation delay. Propagation delay detector 212 includes a series of substantially equal delay blocks DL0–DLn that have a corresponding series of outputs DX0–DXn.

In the example shown in FIG. 2, detector 212 has 51 delay blocks DL0–DL50 that have 51 corresponding outputs DX0–DX50. In this implementation, the last delay block DL50 is connected to always output a logic low. Each delay block DL has a delay of approximately 590 pS, which results in a total delay of approximately 29.5 nS (590 pS*50=29.5 nS). (Since the 51$^{st}$ delay block DL50 always outputs a low, it can not be used to measure the total delay.) In addition, the delay blocks DL are connected to a power node PN that provides the supply voltage.

FIG. 3 shows a circuit diagram that illustrates an example of a delay block DL in accordance with the present invention. As shown in the FIG. 3 example, delay block DL is implemented with a NOR gate 310 and a NAND gate 312 where the output of NOR gate 310 is input to NAND gate 312.

In addition, NOR gate 310 receives the input clock signal ICLK, while the remaining NOR gates 310 receive the output signal Dxprior of the prior NAND gate 312. In addition, NAND gate 312 receives a reset signal RST, which functions as a reset, and outputs an output signal DX. The reset signal RST is output by clock generator 210. (The reset line RST is only shown connected to delay blocks DL16, DL17, and DL18 for clarity.)

FIG. 3B shows a circuit diagram that illustrates a reset circuit 350 in accordance with the present invention. As shown in FIG. 3B, circuit 350 is implemented with a logic AND gate that has an inverted input. The inverted input receives the clock signal ICLK, the non-inverted input receives the slack clock signal SCLK, and the output generates the reset signal RST. An advantage of reset circuit 350 is that the edges can not overlap, i.e., the rising reset edge always follows the rising slack clock edge.

Returning to FIG. 2, propagation delay detector 212 also includes a series of taps TS0–TSm that latch and output the logic states and the inverse logic states that are present on selected delay block outputs DX in response to the sample clock signal SCLK. In addition, the taps TS are connected to the power node PN to receive the supply voltage.

In the example shown in FIG. 2, detector 212 has 33 taps TS0–TS32 that latch and output the logic states and the inverse logic states that are output from delay blocks DL18–DL50. The series of delay taps TS0–TS32, in turn, have 66 corresponding outputs TX0–TX32 and the inverse of these outputs TX0bar–TX32bar that form the propagation delay word PDW that represents the measured delay.

In operation, the rising edge of the input clock signal ICLK is input to the first delay block DL0 of the series. The input clock signal ICLK propagates through each succeeding delay block DL in the series until the rising edge of the sample clock signal SCLK clocks each of the taps TS.

As noted above, both the input clock signal ICLK and the sample clock signal SCLK in the present example are 12.5 MHz signals which, in turn, have 80 nS periods. As further noted above, the sample clock signal SCLK is a quadrature signal with respect to the input clock signal ICLK. Thus, when operating normally, the rising edge of the sample clock signal SCLK clocks each of the taps TS 20 nS after the rising edge of the input clock signal ICLK is input to the first delay block DL0.

FIGS. 4A–4H show timing diagrams that illustrate the operation of the sample clock signal SCLK in accordance with the present invention. As shown in FIGS. 4A–4H, the rising edge of the sample clock signal SCLK occurs midway through the logic high portion of the input clock signal ICLK propagating through first delay block DL0.

As noted above, each delay block DL provides a delay of approximately 590 pS (at nominal operating conditions). As a result, the rising edge of the input clock signal ICLK propagates through 34 delay blocks before the rising edge of the sample clock signal SCLK clocks the taps TS and resets the delay blocks DL (590 pS*34=20.06 nS). This, in turn, causes the first 34 delay blocks DL0–DL33 to output a logic high, while the last 17 delay blocks DL34–DL50 output a logic low (because the rising edge of the input clock signal ICLK did not propagate any further than delay block DL33).

As further noted above, the taps TS0–TS32 are connected to outputs DX18–DX50. As a result, when the rising edge of the input clock signal ICLK propagates through 34 delay blocks, the first 16 taps latch the logic high output from delay blocks DX18–DX33 while the last 17 taps latch a logic low that is output from delay blocks DX34–DX50.

The first 32 delay taps TS0–TS31 are used to measure the propagation delay, while the 33rd tap TS32 always outputs a low. (As described in greater detail below, the logic that evaluates the output of taps TS0–TS32 looks for a logic high to a logic low transition. By insuring that the last tap TS32 always outputs a logic low, a logic high to a logic low transition can always be detected.)

In addition, the first 33 taps TS output the inverse of the latched logic values, or 16 logic lows followed by 17 logic highs on outputs TX0bar–TX32bar. Thus, in this example, propagation delay detector 212 outputs a 66-bit word of a pattern of 32 alternating highs and lows, followed by a pattern of 34 alternating lows and highs when operating normally.

Referring again to FIG. 2, power supply system 200 includes a frequency detector 214 that receives the propagation delay word PDW from propagation detector 212, and generates a encoded multi-bit word ENC that represents the propagation delay word PDW. In the FIG. 2 example, detector 214 receives the 66-bit propagation delay word PDW from taps TS0–TS32 of propagation delay detector 212, and generates a 5-bit encoded word ENC(4:0) that represents the 66-bit word (which includes 32 bits from taps TS0–TS31, a logic low bit from tap TS32, and the inverses).

Figure 5:
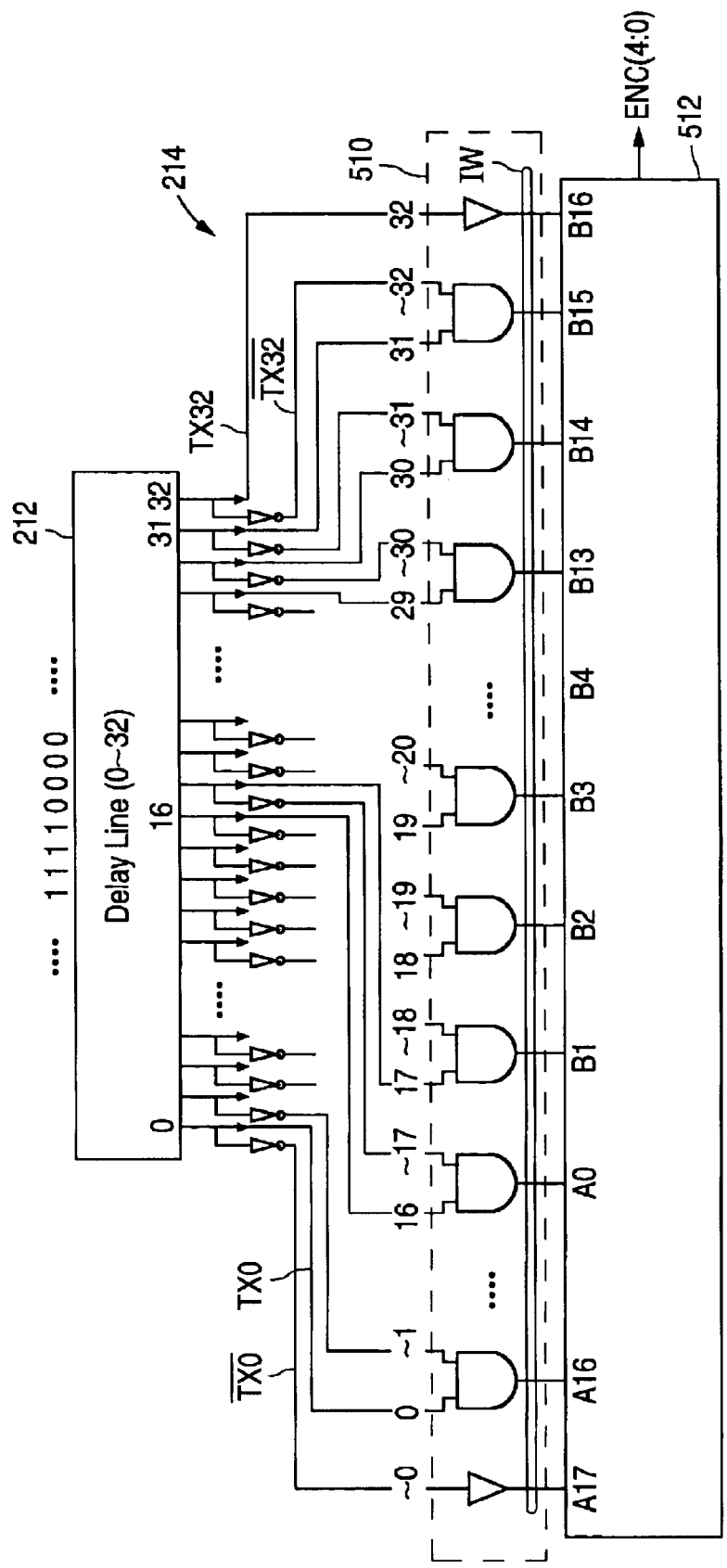
FIG. 5 is a circuit diagram illustrating an example of frequency detector 214 in accordance with the present invention.

FIG. 5 shows a circuit diagram that illustrates an example of frequency detector 214 in accordance with the present invention. As shown in FIG. 5, frequency detector 214 includes a logic block 510 that receives the propagation delay word PDW and outputs an intermediate multi-bit word. In the example shown in FIG. 5, logic block 510 receives the 66-bit word on outputs TX0–TX32 and TX0bar–TX32bar of detector 212, and outputs a 34-bit intermediate word IW in response.

In addition, logic block 510 includes two inverters and 32 AND gates. The first inverter inverts the inverted output TX0bar from tap T0, while the second inverter inverts the non-inverted output TX32 output from tap TS32. Each of the AND gates, in turn, logically ANDs together the non-inverted output of one tap and the inverted output of the next tap in the series. As shown in the FIG. 5 example, the first AND gate ANDs together the non-inverted output signal TX0 of the first tap TS0 and the inverted output signal TX1bar of the second tap TS1.

In addition to logic block 510, detector 214 includes a logic encoder 512 that encodes the intermediate word IW output from logic block 510 to output the encoded word ENC. The following table and equations EQ.1–5 illustrate the definition of the 5-bit encoded word ENC(4:0) of the present example.

|  | A17 | A15 | A13 | A11 | A9 | A7 | A5 | A3 | A1 | B1 | B3 | B5 | B7 | B9 | B11 | B13 | B15 |
|---|---|---|---|---|---|---|---|---|---|---|---|---|---|---|---|---|---|
|  | A16 | A14 | A12 | A10 | A8 | A6 | A4 | A2 | A0 | B2 | B4 | B6 | B8 | B10 | B12 | B14 | B16 |
| ENC4 | 1 1 | 1 1 | 1 1 | 1 1 | 1 1 | 1 1 | 1 1 | 1 1 | 1 1 | 1 1 | 1 1 | 1 1 | 1 1 | 0 0 | 0 0 | 0 0 | 0 0 |
| ENC3 | 1 1 | 1 1 | 1 1 | 1 1 | 1 1 | 1 1 | 0 0 | 0 0 | 0 0 | 0 0 | 1 1 | 1 1 | 1 1 | 1 1 | 0 0 | 0 0 | 0 0 |
| ENC2 | 1 1 | 1 1 | 1 1 | 1 1 | 0 0 | 0 0 | 1 1 | 1 1 | 0 0 | 0 0 | 1 1 | 1 1 | 0 0 | 0 0 | 1 1 | 1 1 | 1 1 |
| ENC1 | 1 1 | 1 1 | 1 1 | 0 0 | 1 1 | 0 0 | 1 1 | 0 0 | 1 1 | 0 0 | 1 1 | 0 0 | 1 1 | 0 0 | 1 1 | 0 0 | 0 0 |
| ENC0 | 1 1 | 1 1 | 1 0 | 1 0 | 1 0 | 1 0 | 1 0 | 1 0 | 1 0 | 1 0 | 1 0 | 1 0 | 1 0 | 1 0 | 1 0 | 1 0 | 1 0 0 |

$$ENC4 = B3+B2+B1+A0+A1+A2+A3+A4+A5+A6+A7+A8+A9+A10+A11+A12+A13+A14+A15+A16+A17 \quad \text{EQ.1}$$

$$ENC3 = A17+A16+A15+A14+A13+A12+A11+A10+A9+A8+A7+A6+A5+B4+B5+B6+B7+B8+B9+B10+B11 \quad \text{EQ.2}$$

$$ENC2 = A17+A16+A15+A14+A13+A12+A11+A10+A9+A4+A3+A2+A1+B4+B5+B6+B7+B12+B13+B14+B15+B16 \quad \text{EQ.3}$$

$$ENC1 = A17+A16+A15+A14+A13+A12+A11+A8+A7+A4+A3+A0+B4+B5+B8+B9+B12+B13 \quad \text{EQ.4}$$

$$ENC0 = A17+A16+A15+A14+A13+A12+A10+A8+A6+A4+A2+A0+B3+B4+B6+B8+B10+B12+B14 \quad \text{EQ.5}$$

Referring again to FIG. 2, power supply system 200 optionally includes an adder/subtractor 216 that adds or subtracts a multi-bit select word SW to the encoded word ENC to output a modified encoded word MW. In the FIG. 2 example, adder/subtractor 216 adds or subtracts a 5-bit select word SW(4:0) to the encoded word ENC(4:0) to output a modified encoded word MW(4:0).

Power supply system 200 includes a clock generator 218 that outputs a plurality of load signals in response to a clock signal, such as the sample clock signal SCLK, and a flip signal FL. The flip signal FL, in turn, is defined by the logic state of an over voltage tap signal TOV. In addition, as described in greater detail below, clock generator 218 also outputs an up signal UP and a down signal DN, and receives a fast clock signal FST.

Figure 6:
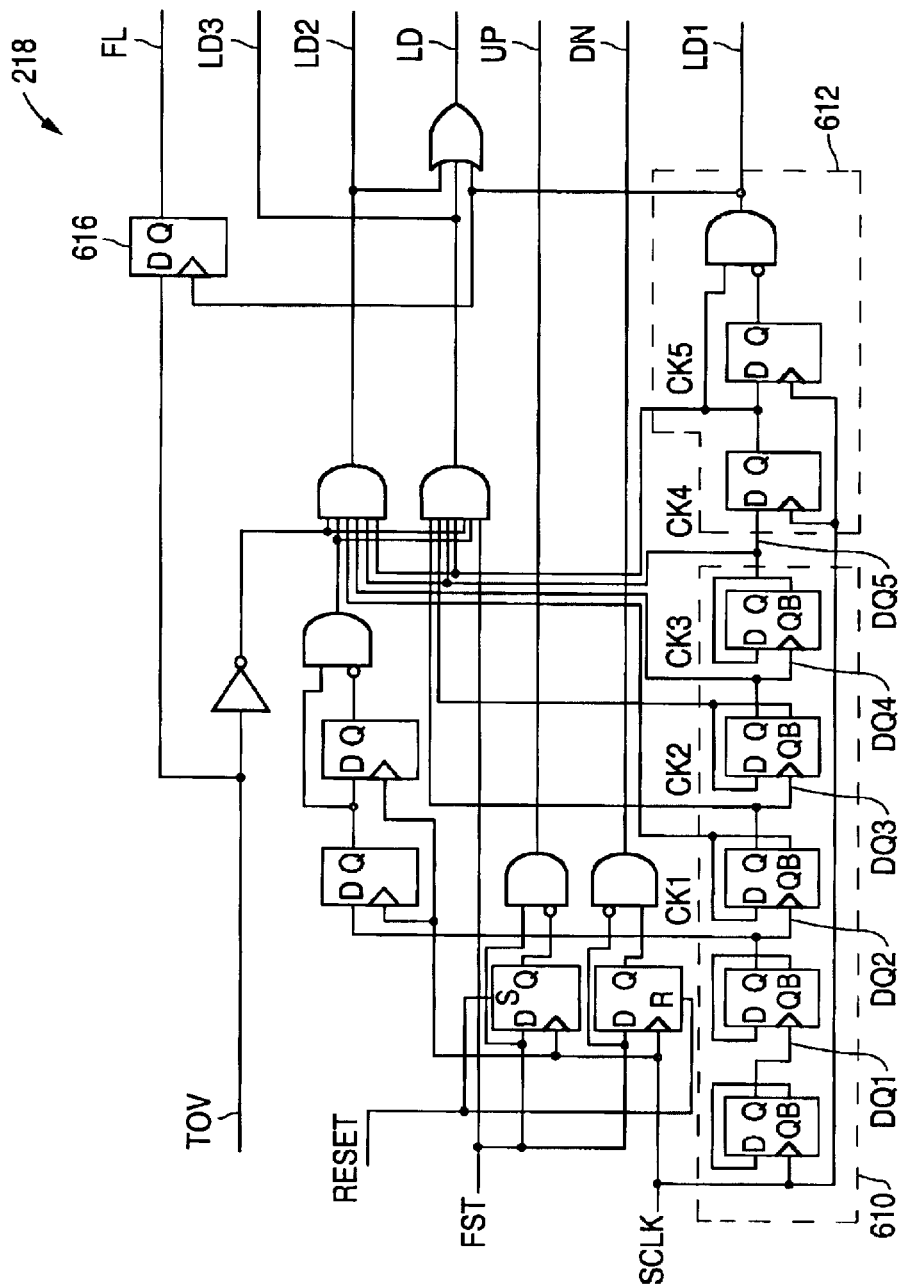
FIG. 6 is a circuit diagram illustrating an example of clock generator 218 in accordance with the present invention.

FIG. 6 shows a circuit diagram that illustrates an example of clock generator 218 in accordance with the present invention. As shown in FIG. 6, generator 218 includes a D-Q flip flop chain 610 that outputs signals DQ1, DQ2, DQ3, DQ4, and DQ5, and a pulse generator circuit 612 that generates an 80 nS pulse every 2.56 uS as a load one signal LD1. In addition, generator 218 includes an OR gate 614 that outputs the load one signal LD1 as a load signal LD.

As further shown in FIG. 6, generator 218 includes a D-Q flip flop 616 that latches and outputs the over voltage tap signal TOV as the flip signal FL when clocked by the load one signal LD1. Thus, each time the load and load one signals LD and LD1 pulse high, the flip signal FL latches the value of the over voltage tap signal TOV.

FIGS. 7A–7F show timing diagrams that illustrate the operation of clock generator 218. As shown in FIGS. 7A–7F, chain 610, pulse generator circuit 612, and OR gate 614 cause the load and load one LD1 signals to output an 80 nS pulse every 2.56 uS.

Power supply system 200 also includes an up/down counter 220 that loads the modified encoded word MW output from adder/subtractor 216 in response to the load signal LD. Once loaded, counter 220 increments or decrements, respectively, the binary value of the modified encoded word MW as a count in response to the flip signal FL and a clock signal. In addition, counter 220 outputs the binary value of the count as a binary word BW.

In the FIG. 2 example, counter 220 loads the 5-bit modified encoded word MW(4:0) output from adder/subtractor 216 in response to load signal LD. Counter 220 then increments or decrements, respectively, the binary value of the 5-bit modified encoded word MW(4:0) as a count in response to the flip signal FL and a clock signal, such as the sample clock signal SCLK.

In addition, counter 220 outputs the binary value of the count as a 5-bit binary word BW(4:0). For example, if the binary value of a loaded 5-bit modified encoded word is 01000, then a single increment of the binary value produces a binary word BW(4:0) of 01001.

Figure 8:
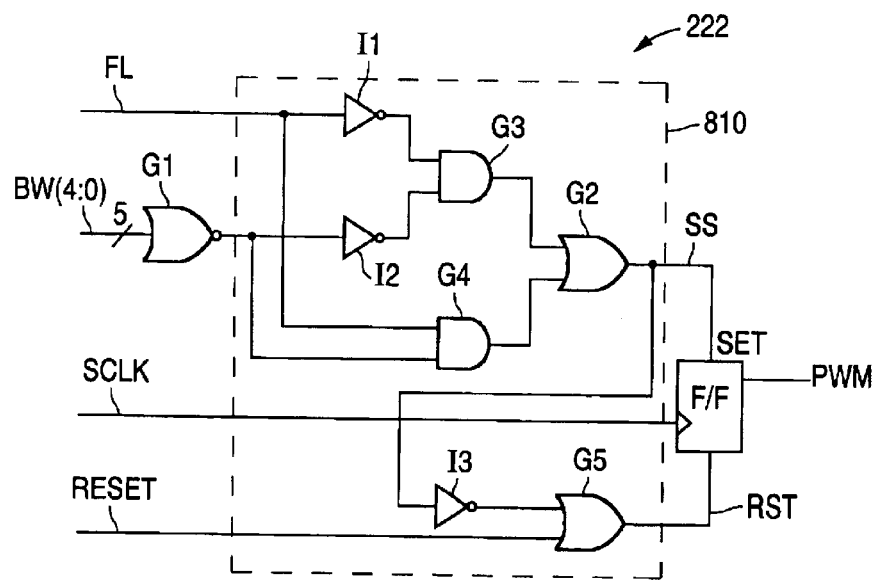
FIG. 8 is a circuit diagram illustrating an example of pulse width modulator 222 in accordance with the present invention.
Figure 9:
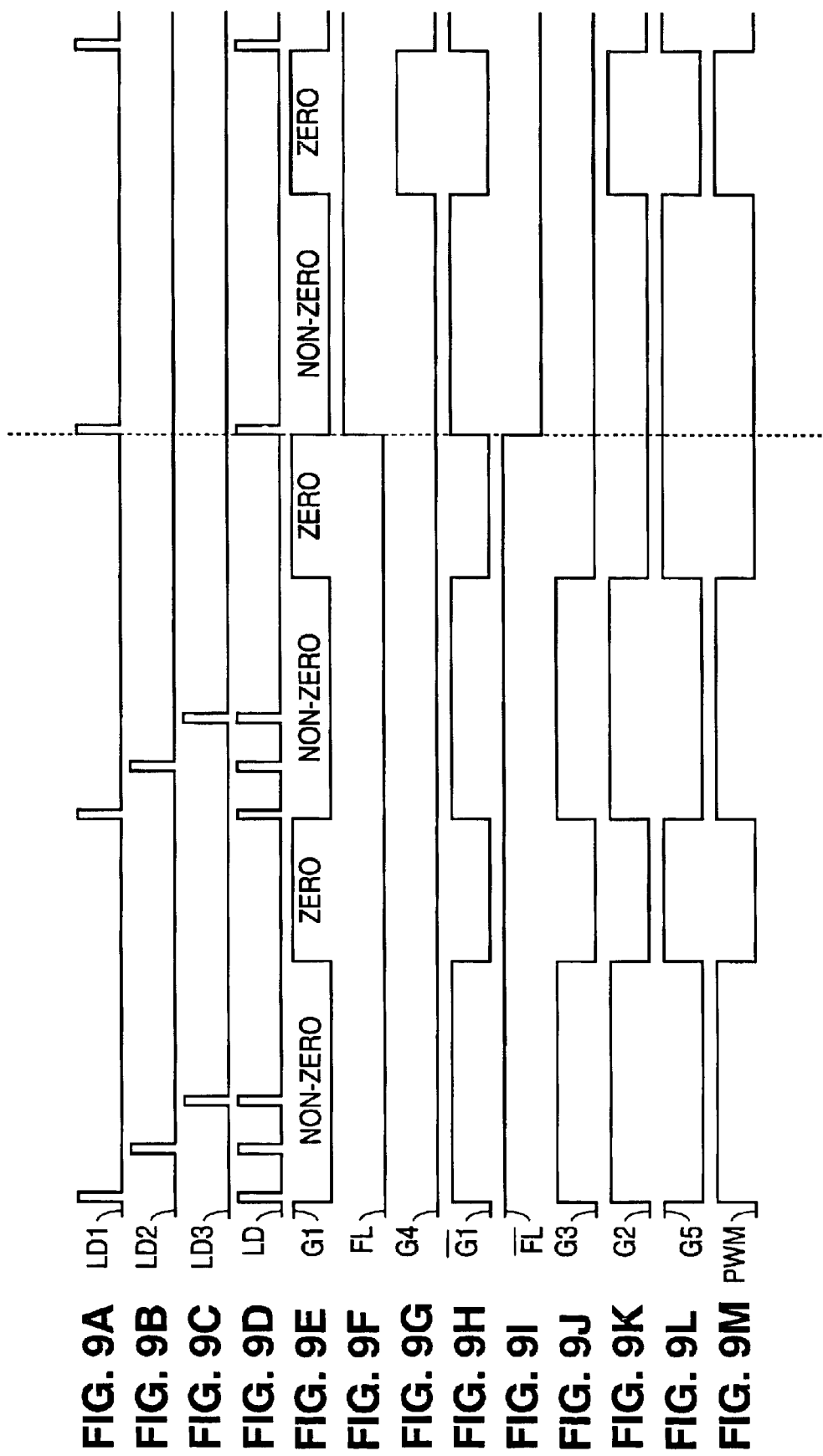
FIGS. 9A–9M are timing diagrams illustrating the operation of pulse width modulator 222 in accordance with the present invention.

As shown in FIG. 2, power supply system 200 also includes a pulse width modulator 222 that outputs a pulse modulated signal PWM where the width of the pulse is defined by the value of the binary word BW that is output from counter 220. FIG. 8 shows a circuit diagram that illustrates an example of pulse width modulator 222 in accordance with the present invention.

As shown in FIG. 8, pulse width modulator 222 includes a NOR gate G1, a set/reset logic block 810, and a flip flop F/F that responds to a clock signal, such as the sample clock signal SCLK. NOR gate G1, in turn, has a multi-bit input that receives the binary word BW(4:0). In operation, NOR gate G1 outputs a logic high only when the value of the count represented by the binary word BW(4:0) is zero.

When a five-bit value is used, the count has a value of zero only once every 32 increments or decrements. Since counter 220 and flip flop F/F are clocked with a 12.5 MHz clock signal, NOR gate G1 produces an 80 nS pulse every 2.56 uS. The position of the pulse within the 2.56 uS period, in turn, is defined by the value of the modified encoded word MW(4:0) that is loaded into counter 220.

Set/reset logic block 810 includes an OR gate G2 that outputs a set signal SS whenever a first input or a second input has a logic high. Set/reset logic block 810 also includes a first AND gate G3 with an output connected to the first input of OR gate G2, and a second AND gate G4 with an output connected to the second input of OR gate G2. AND gate G3 outputs a logic high only when both inputs are high. Similarly, AND gate G4 outputs a logic high only when both inputs are high.

AND gate G3 is connected to the flip signal FL via an inverter I1, while AND gate G4 is directly connected to the flip signal FL. Thus, regardless of the logic state of the flip signal FL, a logic high is input to either gate G3 or gate G4. Similarly, AND gate G3 is connected to the output of NOR gate G1 via an inverter I2, while AND gate G4 is directly connected to the output of NOR gate G1.

Set/reset logic block 810 also includes an inverter I3 that has an input connected to the output of OR gate G2, and an OR gate G5 that has an input connected to the output of inverter I3, and an input connected to a reset signal RST. OR gate G5 outputs the reset signal RST to flip flop F/F.

FIGS. 9A–9M show timing diagrams that illustrate the operation of pulse width modulator 222 in accordance with the present invention. As shown in FIGS. 9A–9M, the load signal LD outputs an 80 nS pulse every 2.56 uS. Counter 220 loads the modified encoded word MW and counts down to zero when the flip signal FL is low. When counter 220 reaches zero, NOR gate G1 (FIG. 7) outputs a logic high which, in turn, causes the output of AND gate G3 to go low, thereby causing the pulse modulated signal PWM to go low.

Referring again to FIG. 2, power supply system 200 includes a level shifter and high voltage driver 224 that level shifts and drives the pulse modulated signal PWM. FIG. 10 shows a block diagram that illustrates an example of a driver stage 1000 in accordance with the present invention.

As shown in FIG. 10, driver stage 1000 includes a p-channel MOS transistor M0 that has a p+ source connected to a supply voltage VDD, and a p+ drain connected to a first node N1 (which is connected to inductor L in FIG. 2). In addition, PMOS transistor M0 has a gate, and an n-well connected to a second node N2.

Driver stage 1000 also has an n-channel MOS transistor M5 that has an n+ source connected to ground VSS, and an n+ drain connected to first node N1. In addition, NMOS transistor M5 has a gate, and a p– substrate connected to a bulk voltage VBULK. PMOS transistor M0 is a large driver transistor that sources a large current to first node N1, while NMOS transistor M5 a large driver transistor that sinks a large current from first node N1.

As further shown in FIG. 10, driver stage 1000 includes a gate signal generator 1010 that outputs a PMOS gate signal G1 to transistor M0, an NMOS gate signal G2 to transistor M5, and a control signal CS. Gate signals G1 and G2 are non-overlapping, while control signal CS can be implemented as the inverse of gate signal G1.

FIGS. 11A–11B show timing diagrams that illustrates the operation of gate signal generator 1010 in accordance with the present invention. As shown in FIGS. 11A–11B, gate signal generator 1010 outputs the gate signals G1 and G2 so that the voltage on gate signal G2 is equal to or less than a turn off voltage TF1 (that turns off transistor M5) before the voltage on gate signal G1 is equal to a turn on voltage TN1 (that turns on transistor M0). Similarly, the voltage on gate signal G1 is equal to or greater than a turn off voltage TF2 (that turns off transistor M0) before the voltage on gate signal G2 is equal to a turn on voltage TN2 (that turns on transistor M5).

The turn off voltages TF1 and TF2 turn off transistors M5 and M0, respectively, such that no current flows out of the drains of the transistors (other than a very small leakage current). The turn on voltages TN1 and TN2 turn on transistors M0 and M5, respectively, such that a current in excess of a leakage current flows out of the drains of the transistors.

Thus, as shown in FIGS. 11A–11B, gate signal generator 1010 prevents transistors M0 and M5 from being turned on at the same time. By preventing transistors M0 and M5 from being turned on at the same time, gate signal generator 1010 saves the power that would be wasted if transistor M5 sunk current directly from transistor M0.

Figure 12:
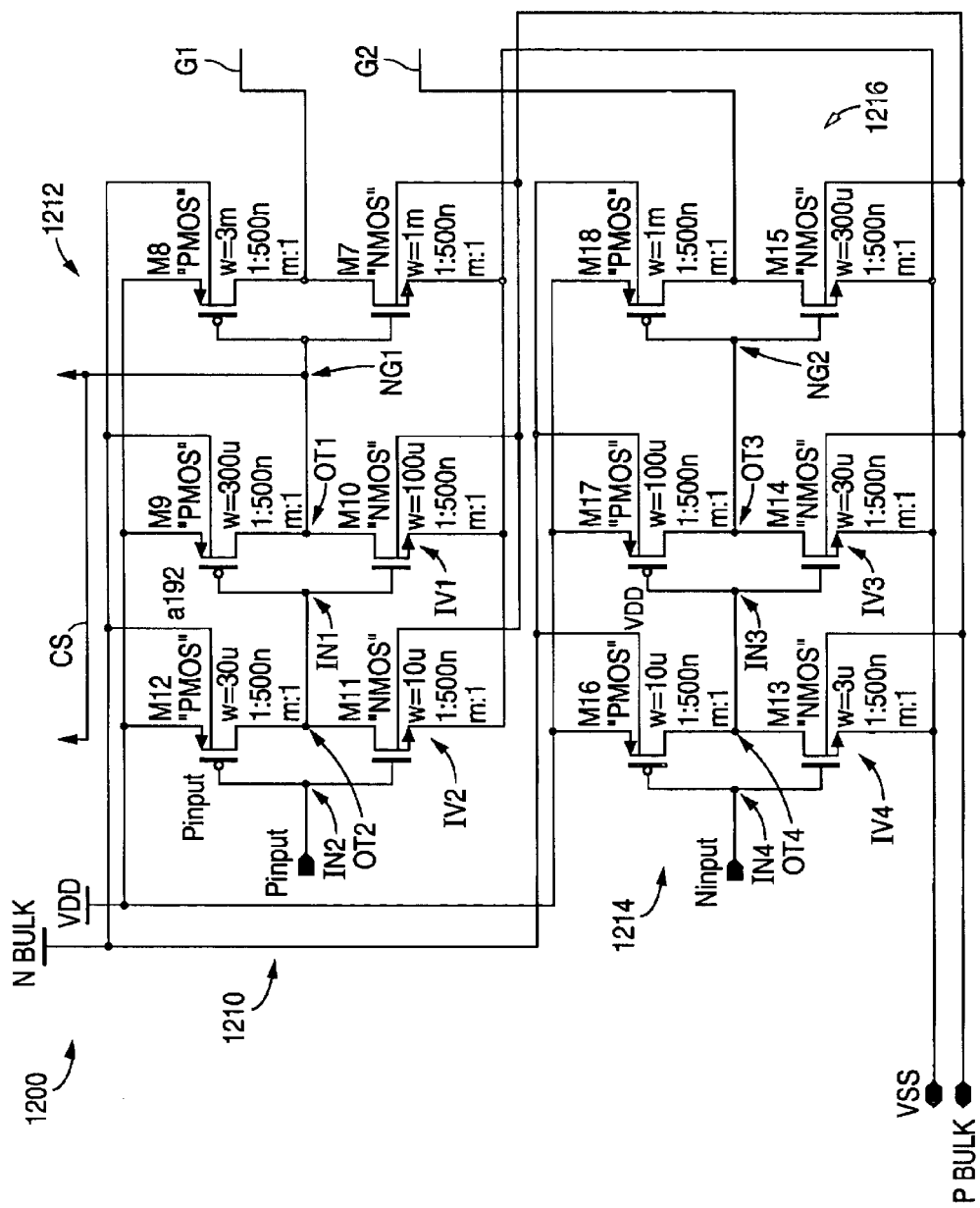
FIG. 12 is a circuit diagram illustrating an example of a gate signal generator 1010 in accordance with the present invention.

FIG. 12 shows a circuit diagram that illustrates an example of a gate signal generator 1200 in accordance with the present invention. As shown in FIG. 12, gate signal generator 1200 has a p-channel delay path 1210 that includes a p-path inverter 1212, and an n-channel delay path 1214 that includes a n-path inverter 1216.

P-path inverter 1212 includes a PMOS transistor M8 and a NMOS transistor M7 that have gates connected to a gate node NG1 and drains that are connected to the gate of transistor M0. In addition, in this example, the control signal CS is taken from the p-path 1210 and output from the gate node NG1.

Further, as shown in FIG. 12, p-path 1210 can include additional inverters that are connected in series. For example, p-path 1210 can include inverter IV1, which is formed from transistors M9/M10, that has an input IN1 and an output OT1 that is connected to the gate node NG1. In addition, path 1210 can include an inverter IV2, which is formed from transistors M11/M12, that has an input IN2 and an output OT2 that is connected to input IN1.

N-path inverter 1216 includes a PMOS transistor M18 and a NMOS transistor M15 that have gates connected to a gate node NG2 and drains that are connected to the gate of transistor M5. Further, as shown in FIG. 12, n-path 1214 can include additional inverters that are connected in series.

For example, n-path 1214 can include inverter IV3, which is formed from transistors M14/M17, that has an input IN3 and an output OT3 that is connected to the gate node GN2. In addition, path 1214 can include an inverter IV4, which is formed from transistors M13/M16, that has an input IN4 and an output OT4 that is connected to input IN3.

The transistors in the p-channel and n-channel delay paths 1210 and 1214 are sized to provide the required edge timing shown in FIG. 11. For example, in the FIG. 12 embodiment, p-channel transistor M8 is 3× larger than p-channel transistor M18. As a result, transistor M8 sources 3× more current than transistor M18 which, in turn, allows transistor M8 to raise the voltage on the gate of transistor M0 faster than transistor M18 can raise the voltage on the gate of transistor M5.

Returning again to FIG. 10, driver stage 1000 additionally includes a first switch SW1 that is connected to ground VSS, the control signal CS, and the well of transistor M0 via node N2; and a second switch SW2 that is connected to ground VSS and the control signal CS. In addition, driver stage 1000 includes a resistor R46 that is connected to the well of transistor M0 via node N2 and to switch SW2.

FIGS. 13A and 13B show circuit diagrams that illustrate an example of switches SW1 and SW2, respectively, in accordance with the present invention. As shown in FIG. 13A, switch SW1 can be implemented as a p-channel MOS transistor M31 that has a p+ source connected to the n-well of PMOS transistor M0 via node N2 and a p+ drain connected to the supply voltage VDD. In addition, transistor M31 has a gate connected to the control signal CS, and a well connected to an n bulk voltage NBULK.

As shown in FIG. 13B, switch SW2 can be implemented as a n-channel MOS transistor M27 that has an n+ source connected to ground VSS and an n+ drain connected to resistor R. In addition, transistor M27 has a gate connected to the control signal CS, and a substrate connected to a p bulk voltage PBULK.

In operation, driver stage 1000 sinks current from node N1 when transistor M0 is turned off and transistor M5 is turned on. Transistor M5 turns on when the voltage of gate signal G2 rises such that the gate-to-source voltage is greater than the threshold voltage of transistor M5.

The voltage of gate signal G1 also rises to turn off transistor M0. At the same time, the control signal CS, which is the inverse of the gate signal G1, falls. The falling control signal CS, in turn, closes switch SW1 and opens switch SW2. When switch SW1 closes, the voltage on the well of transistor M0 is pulled up to approximately the supply voltage VDD.

In addition, driver stage 1000 sources current into node N1 when transistor M0 is turned on and transistor M5 is turned off. Transistor M0 turns on when the voltage on gate signal G1 falls such that the gate-to-source voltage is less than the threshold voltage of transistor M0.

At the same time, the control signal CS, which is the inverse of the gate signal G1, rises. The rising control signal CS opens switch SW1 and closes switch SW2. When switch SW2 closes, the voltage on the well of transistor M0 is pulled down towards ground via a trickle of current that flows through resistor R46.

With respect to the examples shown in FIGS. 12, 13A, and 13B, the control signal CS goes low when the gate signal G1 goes high to turn off transistor M0, thereby turning off transistor M27 and turning on transistor M31. When transistor M31 turns on, the voltage on the well of transistor M0 is pulled up to approximately the supply voltage VDD.

On the other hand, the control signal CS goes high when the gate signal G1 goes low to turn on transistor M0, thereby turning off transistor M31 and turning on transistor M27. When transistor M27 turns on, the voltage on the well of transistor M0 is pulled down towards ground via a trickle of current that flows through resistor R46.

Thus, the present invention provides a bulk switching that pulls down the voltage on the n bulk of PMOS transistor M0 when transistor M0 is turned on, and pulls up the voltage on the n bulk of transistor M0 when transistor M0 is turned off. By pulling the n bulk down during the on state, the threshold voltage of transistor M0 can be increased by several hundred millivolts.

Since the threshold voltage of transistor M0 can be reduced, driver stage 1000 can operate at a lower supply voltage and, therefore, requires less power to operate. In addition, by pulling the n bulk up during the off state, the lower leakage current associated with a high n bulk can be realized.

Further, since PMOS transistor M0 is a driver transistor, transistor M0 is a high-voltage transistor that has a threshold voltage of about −1V. For a low-voltage supply, e.g., 2.6V, a 0.3V or 0.4V improvement in the threshold voltage provides about a 10% total improvement in the drain-to-source turn on resistance of PMOS transistor M0. This, in turn, reduces the silicon area that is required by PMOS transistor M0 by about 10% since the transconductance is a linear function of the gate voltage in the linear and subthreshold region.

FIG. 14 shows a circuit diagram that illustrates a driver stage 1400 in accordance with an alternate embodiment of the present invention. Stage 1400 is similar to stage 1000 and, as a result, utilizes the same reference numerals to designate the structures which are common to both stages.

As shown in FIG. 14, stage 1400 differs from stage 1000 in that stage 1400 includes a third switch SW3 that is connected to and between the well of PMOS transistor M0 and the supply voltage VDD, and controlled by an enable signal EN. Switch SW3 can be implemented with, for example, PMOS transistor M31. In this case, the source and well of transistor M31 are connected to the supply voltage, the drain to node N2, and the gate to the enable signal EN.

As further shown in FIG. 14, stage 1400 additionally includes a fourth switch SW4 that is connected to and between resistor R and switch SW2, and controlled by the enable signal EN. Switch SW4 can be implemented with, for example, NMOS transistor M27. In this case, the source is connected to switch SW2, the drain is connected to resistor R46, and the gate is connected to the enable signal EN.

In operation when the enable signal EN is a logic low, switch SW3 is open while switch SW4 is closed. When switch SW4 is closed, the voltage on the well of PMOS transistor M0 is pulled up to about the supply voltage VDD and held there as transistor M0 is turned on and off.

On the other hand, when the enable signal EN is a logic high, switch SW3 is closed, while switch SW4 is open. When switch SW3 is closed and switch SW4 is open, stage 1400 operates the same as stage 1000. Thus, stage 1400 provides an enable capability that allows the voltage on the n-well of PMOS transistor M0 to be held high rather than be switched low when transistor M0 turns on.

The enable signal EN can be used in a number of different ways. For example, the enable signal EN can be used to form a driver with an adjustable PMOS threshold voltage. When the enable signal EN is deasserted and the n bulk is held high, PMOS transistor M0 has a first threshold voltage, e.g., –1V.

On the other hand, when the enable signal EN is asserted and the bulk switching is enabled, PMOS transistor M0 has a second threshold voltage, e.g., –0.8V, that is higher than the first threshold voltage. In addition, the enable signal EN allows the bulk switching to be disabled for use in high voltage applications, and can be used with a clock signal to turn the bulk switching on and off.

In addition, rather than connecting switch SW1 to the supply voltage VDD, switch SW1 can alternately be connected to a voltage source that is higher than the supply voltage VDD. In this embodiment, the threshold voltage of PMOS transistor M0 can be lowered even further when the bulk switching is enabled.

Figure 15A:
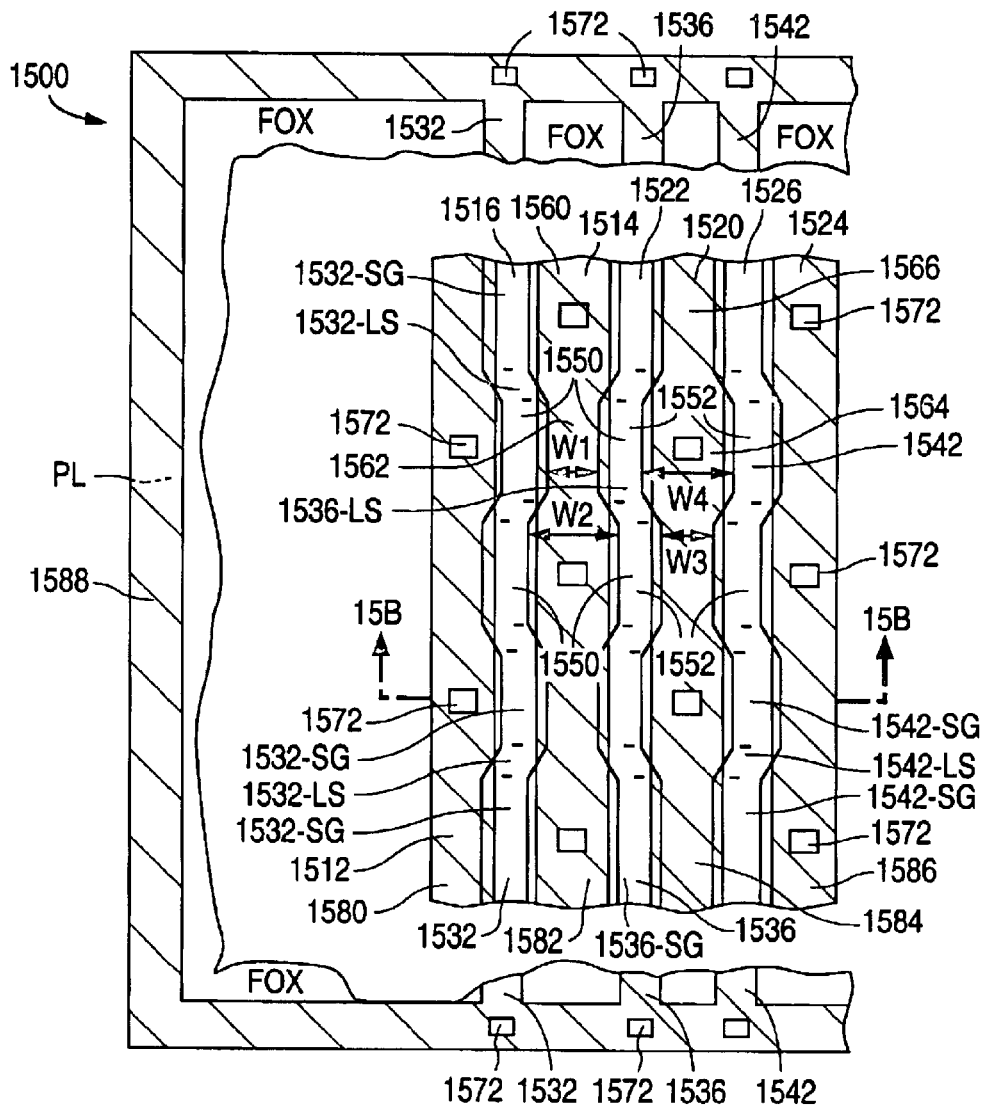
FIGS. 15A–15B are two views illustrating a layout 1500 of PMOS transistor M0 after the metal-1 layer has been formed and patterned in accordance with the present invention.
Figure 15B:
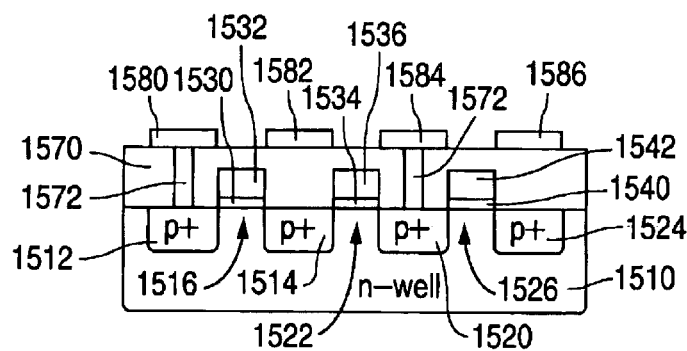

FIGS. 15A–15B show two views that illustrate a layout 1500 of PMOS transistor M0 after the metal-1 layer has been formed and patterned in accordance with the present invention. FIG. 15A shows a plan view, while FIG. 15B shows a cross-sectional view taken along lines 15B—15B of FIG. 15A. As shown in FIGS. 15A–15B, layout 1500 includes an n-well 1510, and a strip of a p+ source region 1512 that is formed in an n-well 1510.

Layout 1500 also includes a strip of a p+ drain region 1514 that is formed in an n-well 1510 a distance apart from source region 1512, and a channel region 1516 that is located between source and drain regions 1512 and 1514. Layout 1500 further includes a strip of a p+ source region 1520 that is formed in an n-well 1510 a distance apart from drain region 1514, and a channel region 1522 that is located between source and drain regions 1520 and 1514.

Further, layout 1500 includes a strip of a p+ drain region 1524 that is formed in an n-well 1510 a distance apart from source region 1520, and a channel region 1526 that is located between source and drain regions 1520 and 1524. Additional strips of p+ source and drain regions can be used to increase the size of transistor M0.

As shown in FIGS. 15A–15B, layout 1500 further includes a layer of gate oxide 1530 that is formed over channel region 1516, and a polysilicon gate strip 1532 that is formed on oxide layer 1530 over channel region 1516. In addition, both ends of polysilicon gate strip 1532 extend out over a field oxide region FOX.

A layer of gate oxide 1534 is also formed over channel region 1522, and a polysilicon gate strip 1536 is formed on oxide layer 1534 over channel region 1522. Both ends of polysilicon gate strip 1536 also extend out over the field oxide region FOX. A layer of gate oxide 1540 is further formed over channel region 1526, and a polysilicon gate strip 1542 is formed on oxide layer 1540 over channel region 1526. Both ends of polysilicon gate strip 1542 extend out over the field oxide region FOX. As further shown in FIG. 15A, polysilicon gate strips 1532, 1536, and 1542 on both ends are connected together via a polysilicon interconnect line PL.

Gate strip 1532 has a number of segments 1532-SG, and a number of linking sections 1532-LS that connect together adjacent segments 1532-SG. Similarly, gate strip 1536 has a number of segments 1536-SG, and a number of linking sections 1536-LS that connect together adjacent segments 1532-SG. Gate strip 1542 also has a number of segments 1542-SG, and a number of linking sections 1542-LS that connect together adjacent segments 1542-SG.

In addition, the segments 1532-SG of gate strip 1532, the segments 1536-SG of gate strip 1536, and the segments 1542-SG of gate strip 1542 are substantially parallel. Each segment 1532-SG of gate strip 1532 also has a corresponding segment 1536-SG of gate strip 1536.

Each segment 1532-SG and the corresponding segment 1536-SG form a segment pair 1550 that has a width measured substantially normal to both segments 1532-SG and 1536-SG. Further, the width of each adjacent segment pair 1550 alternates between a first width W1 and a second width W2 that is wider than first width W1.

In addition, each segment 1536-SG of gate strip 1536 has a corresponding segment 1542-SG that lies a distance apart. Each segment 1536-SG and the corresponding segment 1542-SG form a segment pair 1552 that has a width measured substantially normal to both segments 1536-SG and 1542-SG.

Further, the width of each adjacent segment pair 1552 alternates between a third width W3 and a fourth width W4 that is wider than third width W3. In addition, each segment pair 1550 has a corresponding and adjoining segment pair 1552. When a segment pair 1550 has the second width, the corresponding segment pair 1552 has the third width. Similarly, when a segment pair 1550 has the first width, the corresponding segment pair 1552 has the fourth width.

As shown in FIG. 15A, a number of adjacent segment pairs 1550 forms an alternating series of wide and narrow regions 1560 and 1562, respectively, while a number of adjacent segment pairs 1552 forms an alternating series of wide and narrow regions 1564 and 1566, respectively.

In addition to the above, layout 1500 also includes a layer of isolation material 1570, and a number of contacts 1572 that are formed through isolation material 1570 to make an electrical connection with source strip 1512, drain strip 1514, source strip 1520, drain strip 1524, and interconnect line PL. The contacts 1572, in turn, are formed generally in the middle of each wide region 1560 and 1564, and periodically on interconnect line PL.

Further, layout 1500 includes a plurality of strips of metal-1 that include a source strip 1580, a drain strip 1582, a source strip 1584, a drain strip 1586, and an interconnect strip 1588. Source strip 1580 is formed on isolation material 1570 to make electrical contact with the contacts 1572 that make an electrical connection with p+ source strip 1512.

Drain strip 1582 is formed on isolation material 1570 to make electrical contact with the contacts 1572 that make an electrical connection with p+ drain strip 1514. Source strip 1584 is formed on isolation material 1570 to make electrical contact with the contacts 1572 that make an electrical connection with p+ source strip 1520.

Drain strip 1586 is formed on isolation material 1570 to make electrical contact with the contacts 1572 that make an electrical connection with p+ drain strip 1524. Interconnect strip 1588 is formed on isolation material 1570 to make electrical contact with the contacts 1572 that make an electrical connection with polysilicon interconnect line PL which, in turn, is connected to gate strips 1532, 1536, and 1542.

Thus, in accordance with the present invention, a layout has been described that utilizes a plurality of serrated gate structures that allow the source and drain regions to contacted frequently. The result is a 25% savings in space over conventional layouts.

In addition, picking up the gate strips on both ends with a layer of interconnect polysilicon and a metal-1 strip reduces the distributed RC delay associated with the gate strips (the resistance of the polysilicon strips and the capacitance under the gate strips) by a factor of two to three times.

Figure 16A:
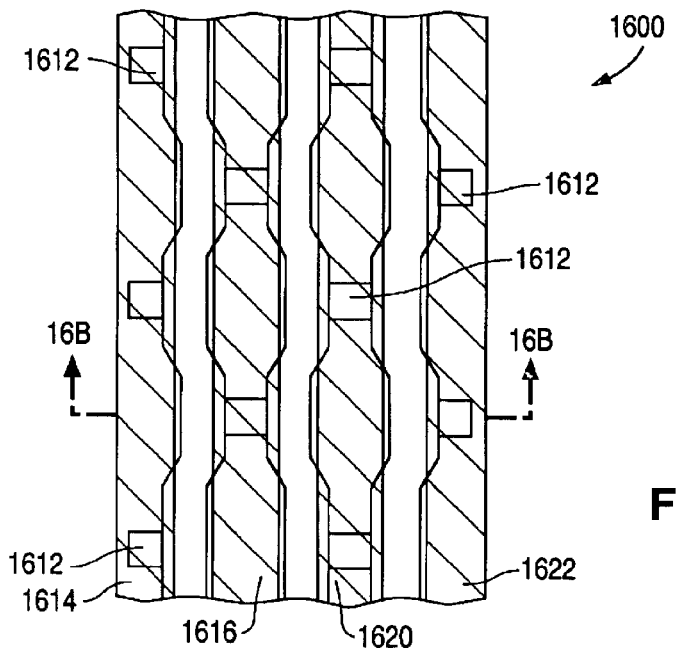
FIGS. 16A–16B are two views illustrating a layout 1600 of PMOS transistor M0 after the metal-2 layer has been formed and patterned in accordance with the present invention.
Figure 16B:
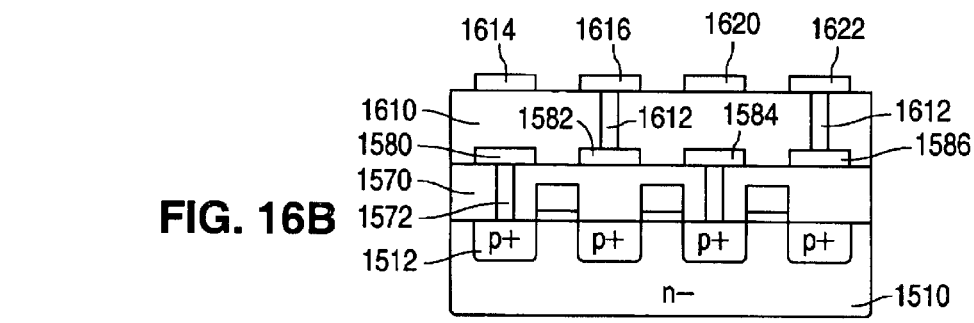

FIGS. 16A–16B show two views that illustrate a layout 1600 of PMOS transistor M0 after the metal-2 layer has been formed and patterned in accordance with the present invention. FIG. 16A shows a plan view, while FIG. 16B shows a cross-sectional view taken along lines 16B—16B of FIG. 16A. As shown in FIGS. 16A–16B, layout 1600 is the same as layout 1500 except that layout 1600 shows the additional formation of a layer of isolation material 1610, vias 1612 that are formed through isolation layer 1610, and a plurality of strips of metal-2.

The metal-2 strips include a source strip 1614, a drain strip 1616, a source strip 1620, and a drain strip 1622. Source strip 1614 is formed on isolation material 1610 to make electrical contact with the vias 1612 that make an electrical connection with source strip 1580.

Drain strip 1616 is formed on isolation material 1610 to make electrical contact with the contacts 1612 that make an electrical connection with drain strip 1582. Source strip 1620 is formed on isolation material 1610 to make electrical contact with the contacts 1612 that make an electrical connection with p+ source strip 1584.

Drain strip 1622 is formed on isolation material 1612 to make electrical contact with the contacts 1612 that make an electrical connection with drain strip 1586. (Although not shown, a metal-2 interconnect strip is formed over the metal-1 interconnect strip 1588 and electrically connected by vias.)

Figure 17A:
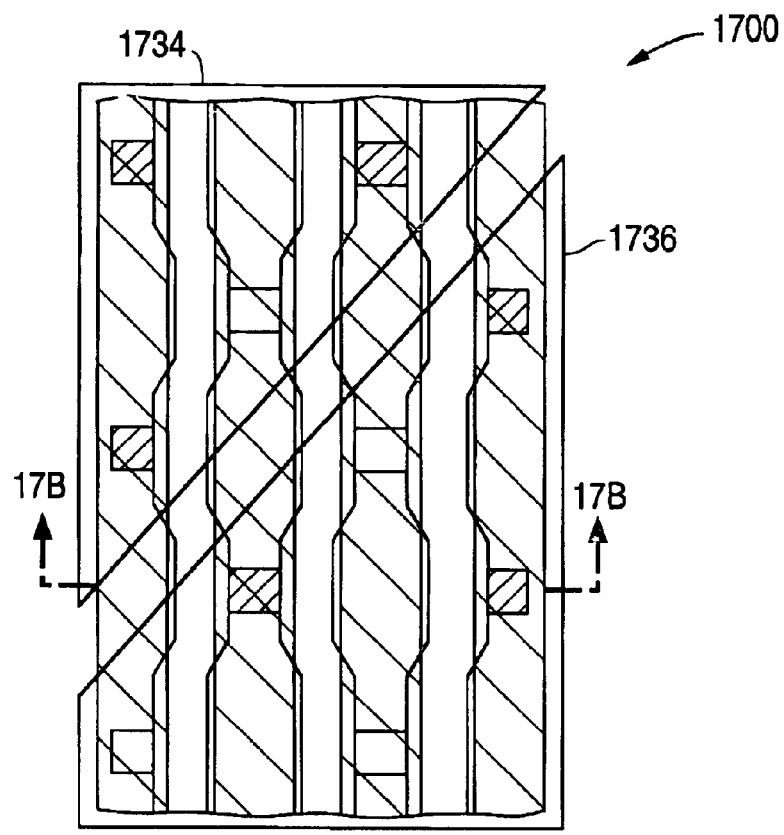
FIGS. 17A–17B are two views illustrating a layout 1700 of PMOS transistor M0 after the metal-4 layer has been formed and patterned in accordance with the present invention.
Figure 17B:
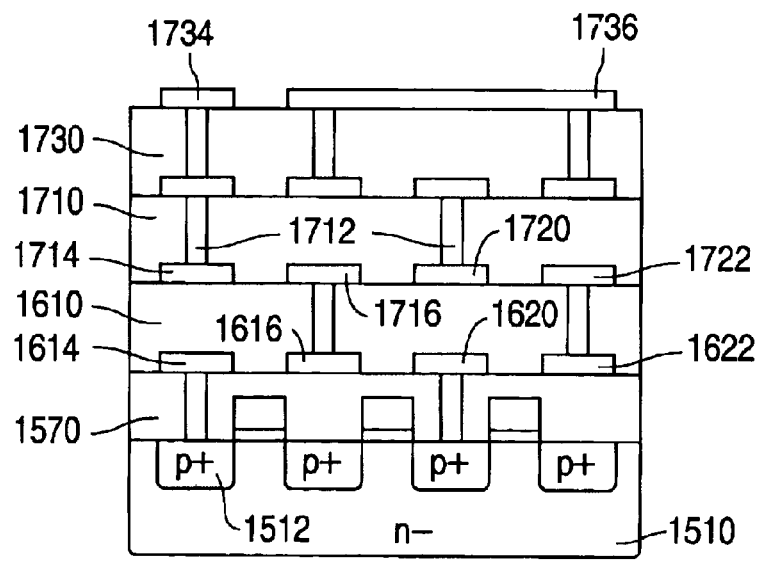

FIGS. 17A–17B show two views that illustrate a layout 1700 of PMOS transistor M0 after the metal-4 layer has been formed and patterned in accordance with the present invention. FIG. 17A shows a plan view, while FIG. 17B shows a cross-sectional view taken along lines 17B—17B of FIG. 17A. As shown in FIGS. 17A–17B, layout 1700 is the same as layout 1600 except that layout 1700 shows the additional formation of a layer of isolation material 1710, vias 1712 that are formed through isolation layer 1710, and a plurality of strips of metal-3.

The metal-3 strips include a source strip 1714, a drain strip 1716, a source strip 1720, and a drain strip 1722. Source strip 1714 is formed on isolation material 1710 to make electrical contact with the vias 1712 that make an electrical connection with source strip 1614. Drain strip 1716 is formed on isolation material 1710 to make electrical contact with the vias 1712 that make an electrical connection with drain strip 1616.

Source strip 1720 is formed on isolation material 1710 to make electrical contact with the contacts 1712 that make an electrical connection with p+ source strip 1620. Drain strip 1722 is formed on isolation material 1710 to make electrical contact with the vias 1712 that make an electrical connection with drain strip 1622. (Although not shown, a metal-3 interconnect strip is formed over the metal-2 interconnect strip and electrically connected by vias.)

Layout 1700 shows the additional formation of a layer of isolation material 1730, vias 1732 that are formed through isolation layer 1730, and two triangles of metal-4. The metal-4 triangles include a source triangle 1734 and a drain triangle 1736. Source triangle 1734 is formed on isolation material 1730 to make electrical contact with all of the vias 1712 that make an electrical connection with metal-3 source strips, including source strips 1714 and 1720. Drain triangle 1736 is formed on isolation material 1730 to make electrical contact with all of the vias 1732 that make an electrical connection with metal-3 drain strips, including drain strips 1716 and 1722.

Figure 18:
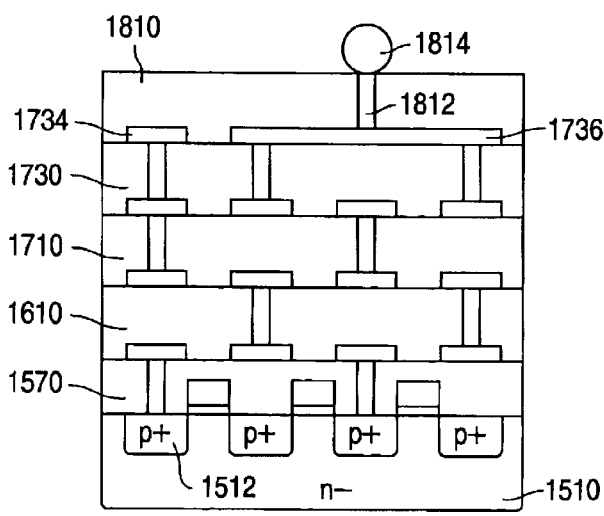
FIG. 18 is a cross-sectional view taken along lines 17B—17B of FIG. 17A illustrating a layout 1800 after the formation of solder balls in accordance with the present invention.

FIG. 18 shows a cross-sectional view taken along lines 17B—17B of FIG. 17A that illustrates a layout 1800 after the formation of solder balls in accordance with the present invention. As shown in FIG. 18, layout 1800 is the same as layout 1700 except that layout 1800 shows the additional formation of a layer of isolation material 1810, vias 1812 that are formed through isolation layer 1810, and a plurality of solder balls 1814. Solder balls 1814 are formed as big balls to minimize parasitic contributions to the source-to-drain turn on resistance of PMOS transistor M0.

Other than differing conductivity types (e.g., n+ source and drain regions in lieu of p+ source and drain regions), the layout of transistor M5 of FIG. 10 is the same as the layout of transistor M0 of FIG. 10. In accordance with an alternate embodiment of the present invention, the contacts and vias used in PMOS transistor M0 are larger (wider) than the contacts and vias used in NMOS transistor M5.

As a result, the larger contacts used on PMOS transistor M0 reduce the resistance associated with the contacts. (Larger contacts are not used on the NMOS transistor M5 because the p+ source, n-channel region, and p+ drain form a parasitic bipolar transistor which, in response to transients, can exhibit snapback characteristics if the transients exceed the rail or falls below ground.)

In accordance with a further embodiment of the present invention, the source regions (which correspond with the emitter of the parasitic bipolar transistor) of NMOS transistor M5 are wider than the drain regions of NMOS transistor M5 (while the source and drain regions both have the same length and depth). In this embodiment, the contacts and vias of PMOS transistor M0 are the same size as the contacts and vias of NMOS transistor M5, however, NMOS transistor has more gate strips than PMOS transistor M0.

Increasing the width of the source regions effectively increases the resistance. Since the source regions function as the emitter regions of the parasitic bipolar transistor, increasing the widths of the source regions is equivalent to adding resistance to the emitter of a bipolar transistor.

By ballasting, adding resistance to the emitter, a large number of bipolar transistors can be placed in parallel without one transistor, usually the center one, heating up and hogging the current. Thus, the wider source regions more evenly distribute the current and reduce the likelihood that the parasitic bipolar transistors in NMOS transistor M5 will enter snapback and fail.

Thus, an output driver stage, including the layout of the PMOS driver transistor of the output stage, has been described. The present invention utilizes both circuit techniques (pulling down the well) and layout techniques, (serrated gate structures) to obtain approximately a 25%–35% improvement in the source-to-drain turn on resistance of PMOS transistor M0.

Figure 19:
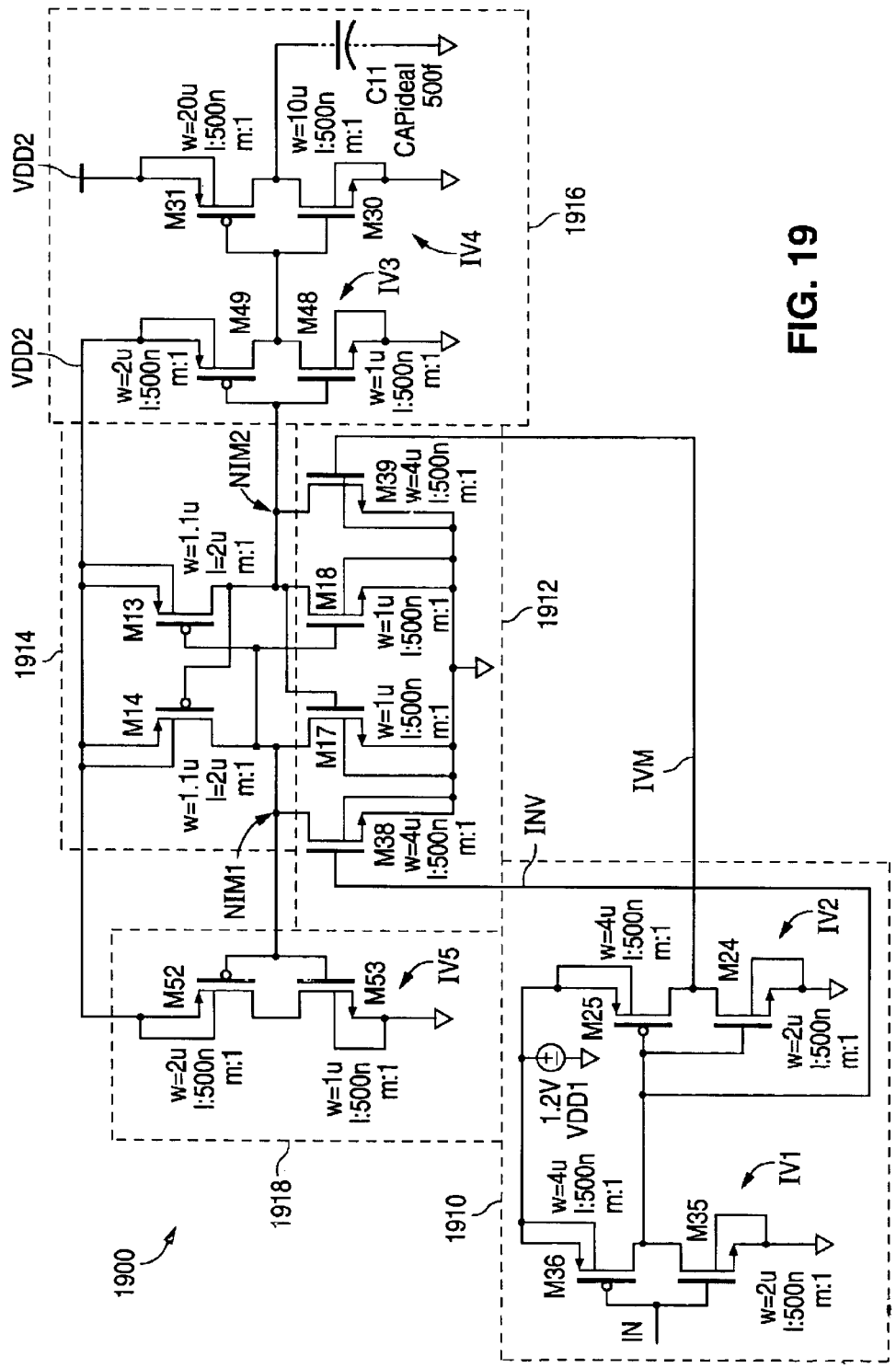
FIG. 19 is a circuit diagram illustrating an example of a level shifter 1900 in accordance with the present invention.

FIG. 19 shows a circuit diagram that illustrates an example of a level shifter 1900 in accordance with the present invention. As shown in FIG. 19, level shifter 1900 includes an input stage 1910 that receives an input digital signal IN, and outputs an inverted input signal INV and a non-inverted input signal IVM. Input stage 1910 has a first inverter IV1 that inverts the input digital voltage IN and outputs the inverted input signal INV, and a second inverter IV2 that inverts the inverted input signal INV and outputs the non-inverted input signal IVN.

First inverter IV1 includes a PMOS transistor M36 that has a source connected to a first power supply VDD1, such as 1.2V, a drain, and a gate connected to receive the input signal IN. In addition, first inverter IV1 also includes an NMOS transistor M35 that has a source connected to ground, a drain connected to the drain of PMOS transistor M36, and a gate connected to receive the input signal IN.

Second inverter IV2 includes a PMOS transistor M25 that has a source connected to the first power supply VDD1, a drain, and a gate connected to receive the output of inverter IV1. In addition, second inverter IV2 also includes an NMOS transistor M24 that has a source connected to ground, a drain connected to the drain of PMOS transistor M24, and a gate connected to output of inverter IV1.

As further shown in FIG. 19, level shifter 1900 includes a pull down stage 1912. Pull down stage 1912, which is connected to the first intermediate node NIM1 and the second intermediate node, pulls down the voltage on the first intermediate node NIM1 when the input digital voltage IN is in a first logic state, and pulls down the voltage on the second intermediate node NIM2 when the input voltage IN is in a second logic state.

Pull down stage 1912 includes a NMOS transistor M38 and a NMOS transistor M39. NMOS transistor M38 has a source connected to ground, a drain connected to the first intermediate node NIM1, and a gate connected to the drains of transistors M35 and 36 of inverter IV1. NMOS transistor M39 has a source connected to ground, a drain connected to the second intermediate node NIM2, and a gate and the drains of transistors M25 and 24 of inverter IV2.

In accordance with the present invention, pull down stage 1912 also includes a NMOS transistor M17 and a NMOS transistor M18. NMOS transistor M17 has a source connected to ground, a drain connected to the first intermediate node NIM1, and a gate connected to the second intermediate node NIM2. NMOS transistor M18 has a source connected to ground, a drain connected to the second intermediate node NIM2, and a gate connected to the first intermediate node NIM1.

Level shifter 1900 also includes a cross-coupled pull-up stage 1914 that pulls up the voltage on the first intermediate node NIM1 to a level shifted voltage (e.g., 3.6 volts) when the input voltage IN is a logic high. Stage 1914 also pulls up the voltage on the second intermediate node NIM2 to the level shifted voltage when the input voltage IN is a logic low.

Pull up stage 1914 includes a PMOS transistor M14 and a PMOS transistor M13. PMOS transistor M14 has a source connected to a second power supply VDD2 (e.g., 3.6 volts), a drain connected to the first intermediate node NIM1, and a gate connected to the second intermediate node NIM2. PMOS transistor M13 has a source connected to the second power supply VDD2, a drain connected to the second intermediate node NIM2, and a gate connected to the first intermediate node NIM1.

Level shifter 1900 also includes a buffer output stage 1916 that is connected to the second intermediate node NIM2, and an inverting output stage 1918 that is connected to the first intermediate node NIM1. Output stage 1916 includes a third inverter IV3 that inverts the voltage on the second intermediate node NIM2, and a fourth inverter IV4 that inverts the voltage output from inverter IV3.

Third inverter IV3 includes a PMOS transistor M49 that has a source connected to the power supply VDD2, a drain, and a gate connected to receive the signal on the second intermediate node NIM2. In addition, third inverter IV3 also includes an NMOS transistor M48 that has a source connected to ground, a drain connected to the drain of PMOS transistor M49, and a gate connected to receive the signal on the second intermediate node NIM2.

Fourth inverter IV4 includes a PMOS transistor M31 that has a source connected to the second power supply VDD2, a drain, and a gate connected to receive the output of inverter IV3. In addition, second inverter IV4 also includes an NMOS transistor M30 that has a source connected to ground, a drain connected to the drain of PMOS transistor M31, and a gate connected to output of inverter IV3.

Output stage 1918 includes a fifth inverter IV5 that inverts the voltage on the first intermediate node NIM1. Fifth inverter IV5 includes a PMOS transistor M52 that has a source connected to the power supply VDD2, a drain, and a gate connected to receive the signal on the first intermediate node NIM1.

In addition, fifth inverter IV5 also includes an NMOS transistor M53 that has a source connected to ground, a drain connected to the drain of PMOS transistor M52, and a gate connected to receive the signal on the first intermediate node NIM1. Inverter IV5 also provides balance such that the first and second intermediate nodes NIM1 and NIM2 see the same load.

In operation, when the input voltage IN is a logic low, transistor M38 turns on in response to the logic high of the inverted input signal INV, and begins to pull down the voltage on the first intermediate node NIM1 to ground. Transistor M39, on the other hand, turns off in response to the logic low of the non-inverted input signal IVM.

Since the gate of PMOS transistor M13 is also connected to the first intermediate node NIM1, the falling voltage turns on transistor M13, thereby pulling up the voltage on the second intermediate node NIM2. Since the gate of NMOS transistor M17 is connected to the second intermediate node NIM2, the rising voltage on the second intermediate node NIM2 turns on transistor M17.

When transistor M17 turns on, two transistors pull the first intermediate node NIM1 to ground. This reduces the amount of time required to pull down the voltage on the first intermediate node NIM1 past the trip voltage of inverter IV5 (the voltage where inverter IV5 changes logic states), thereby turning on inverter IV5 sooner and increasing the speed of level shifter 1900.

For example, assume that the voltage on the first intermediate node NIM1 is +3.6V, that PMOS transistor M13 has a threshold voltage of −1.0V, and NMOS transistor M17 has a threshold voltage of +1.0V. Further assume that the trip voltage of inverter IV5 is +1.0V, i.e., NMOS transistor M53 turns off when the voltage on the first intermediate node NIM1 reaches +1.0V.

Thus, when transistor M38 turns on, PMOS transistor M13 turns on when the voltage on the first intermediate node NIM1 is approximately +2.6V. Transistor M38 continues to pull down the voltage on the first intermediate node NIM1 while transistor M13 charges up the voltage on the second intermediate node NIM2.

When the voltage on the second intermediate node NIM2 reaches approximately 1.0V, transistor M17 turns on and helps transistor M38 pull the voltage on the first intermediate node NIM1 down to the trip voltage (e.g., +1.0V) of transistor M53 faster, thereby increasing the speed to level shifter 1900.

The low voltage on the first intermediate node NIM1 also turns off transistor M18. In addition, inverter IV5 inverts the logic low on the first intermediate node NIM1 to drive a logic high at the level shifted voltage, e.g., 3.6 volts. Further, inverter IV3 inverts the logic high on the second intermediate node NIM2, and inverter IV4 inverts the output of inverter IV3 to drive a logic high at the level shifted voltage.

On the other hand, when the input voltage IN is a logic high, transistor M39 turns on in response to the logic high of the non-inverted input signal IVM, and begins to pull down the voltage on the second intermediate node NIM2 to ground. Transistor M38, on the other hand, turns off in response to the logic low of the inverted input signal INV.

Since the gate of PMOS transistor M14 is also connected to the second intermediate node NIM2, the falling voltage turns on transistor M14, thereby pulling up the voltage on the first intermediate node NIM1. Since the gate of NMOS transistor M18 is connected to the first intermediate node NIM1, the rising voltage on the first intermediate node NIM1 turns on transistor M18.

When transistor M18 turns on, two transistors pull the second intermediate node NIM2 to ground. This reduces the amount of time required to pull down the voltage on the second intermediate node NIM2 past the trip voltage of inverter IV3 (the voltage where inverter IV3 changes logic states), thereby turning on inverter IV3 sooner and increasing the speed of level shifter 1900.

For example, assume that the voltage on the second intermediate node NIM2 is +3.6V, that PMOS transistor M14 has a threshold voltage of −1.0V, and NMOS transistor M18 has a threshold voltage of +1.0V. Further assume that the trip voltage of inverter IV3 is +1.8V. Further assume that the trip voltage of inverter IV3 is +1.0V, i.e., NMOS transistor M48 turns off when the voltage on the second intermediate node NIM2 reaches +1.0V.

Thus, when transistor M39 turns on, PMOS transistor M14 turns on when the voltage on the second intermediate node NIM2 is approximately +2.6V. Transistor M39 continues to pull down the voltage on the second intermediate node NIM2 while transistor M14 charges up the voltage on the first intermediate node NIM1.

When the voltage on the first intermediate node NIM1 reaches approximately +1.0V, transistor M18 turns on and helps transistor M39 pull the voltage on the second intermediate node NIM2 down to the trip voltage (e.g., +1.0V) of transistor M48 faster, thereby increasing the speed to level shifter 1900.

The low voltage on the second intermediate node NIM2 also turns off transistor M17. In addition, inverter IV5 inverts the logic high on the first intermediate node NIM1 to drive a logic low. Further, inverter IV3 inverts the logic low on the second intermediate node NIM2, and inverter IV4 inverts the output of inverter IV3 to drive a logic low.

Thus, level shifter 1900 provides an increased speed by utilizing transistors M17 and M18 which, in turn, reduce the time required to pull down the voltages on the first and second intermediate nodes NIM1 and NIM2 past the trip voltages of the inverters.

Figure 20A:
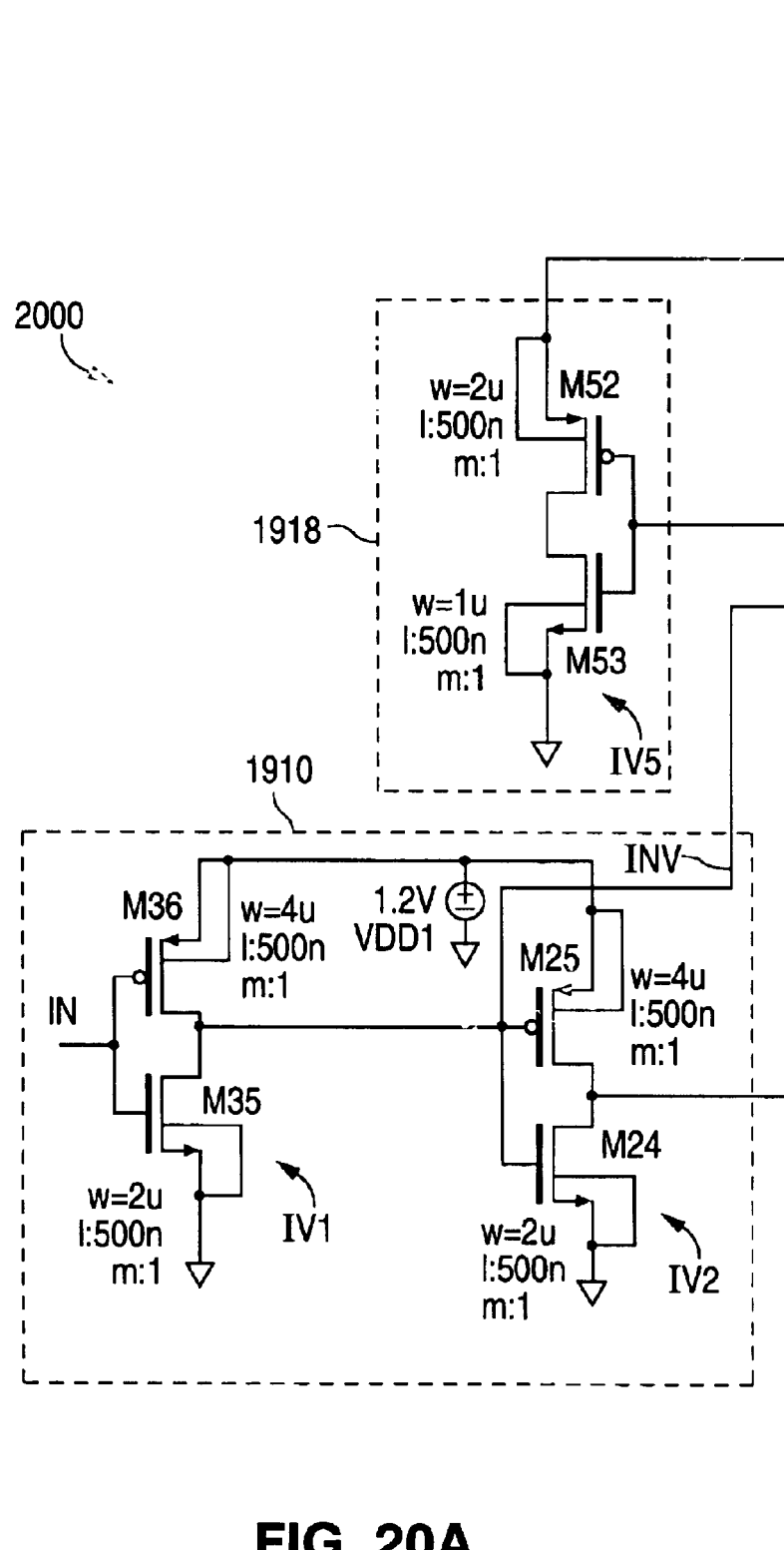
FIG. 20 is a circuit diagram illustrating an example of a level shifter 2000 in accordance with an alternate embodiment of the present invention.
Figure 20B:
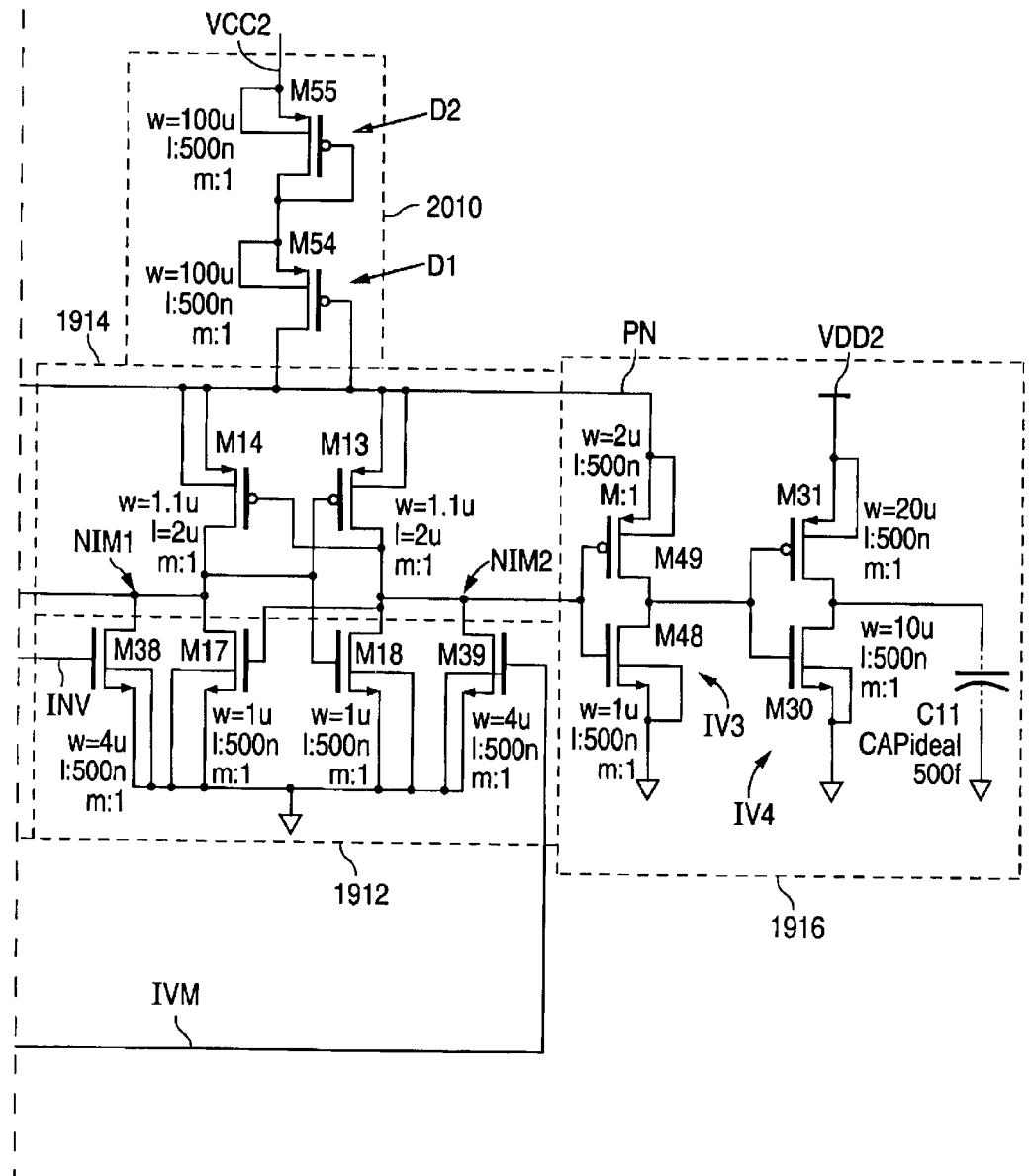

FIG. 20 shows a circuit diagram that illustrates an example of a level shifter 2000 in accordance with an alternate embodiment of the present invention. Level shifter 2000 is similar to level shifter 1900 and, as a result, utilizes the same reference numerals to designate the structures that are common to both level shifters.

As shown in FIG. 20, level shifter 2000 differs from level shifter 1900 in that level shifter 2000 includes a voltage drop stage 2010 that includes a number of diodes D1–Dn. In the example shown in FIG. 20, level shifter 2000 includes two series-connected diodes D1 and D2. Diode D1 is implemented with a PMOS transistor M54 that has a source, a drain connected to a stepped down power node PN, and a gate connected to the drain of transistor M54.

Diode D2 is implemented with a PMOS transistor M55 that has a source connected to the second voltage VCC2, a drain connected to the source of transistor M54, and a gate connected to the drain of transistor M55. Level shifter 2000 operates the same as level shifter 1900, except that diodes D1-Dn provide the ability to receive a first voltage, such as 1.2 volts, output a level shifted voltage, such as 3.6 volts, while operating in a higher voltage environment, such as 5.5 volts.

One of the advantages of level shifter 2000 is that level shifter 2000 can maintain high-speed operation over a larger range of supply voltages. For example, when the second voltage source VCC2 is approximately 3.6V, one-half of that voltage is 1.8V. If NMOS transistor M48 has a threshold voltage of +1.0V (transistor M48 turns off when the voltage on the second intermediate node NIM2 falls below +1.0V), then the distance between the center voltage and the threshold voltage of transistor M48 is 0.8V.

On the other hand, when the second voltage source VCC2 is approximately 5.6V, one-half of that voltage is 2.8V. If NMOS transistor M48 has a threshold voltage of +1.0V, then the distance between the center voltage and the threshold voltage of transistor M48 is now 1.8V. As the distance between the center voltage and the threshold voltage continues to grow, the speed of inverter IV3 slows.

Thus, by utilizing voltage drop stage 2010 to drop the supply voltage VCC2 from, for example, 5.6 volts to, for example, 3.6 volts, level shifter 2000 can provide the same speed and performance as level shifter 1900 while operating with a much higher supply voltage VCC2.

Inverters 1900 and 2000 can be changed from inverting level shifters to non-inverting level shifters by moving inverter IV4 to be connected to inverter IV5. In this case, inverter IV3 outputs a non-inverting voltage, while inverter IV4, which has its gates connected to the drains of transistors M52 and M53, also outputs a latched non-inverting voltage.

Figure 21:
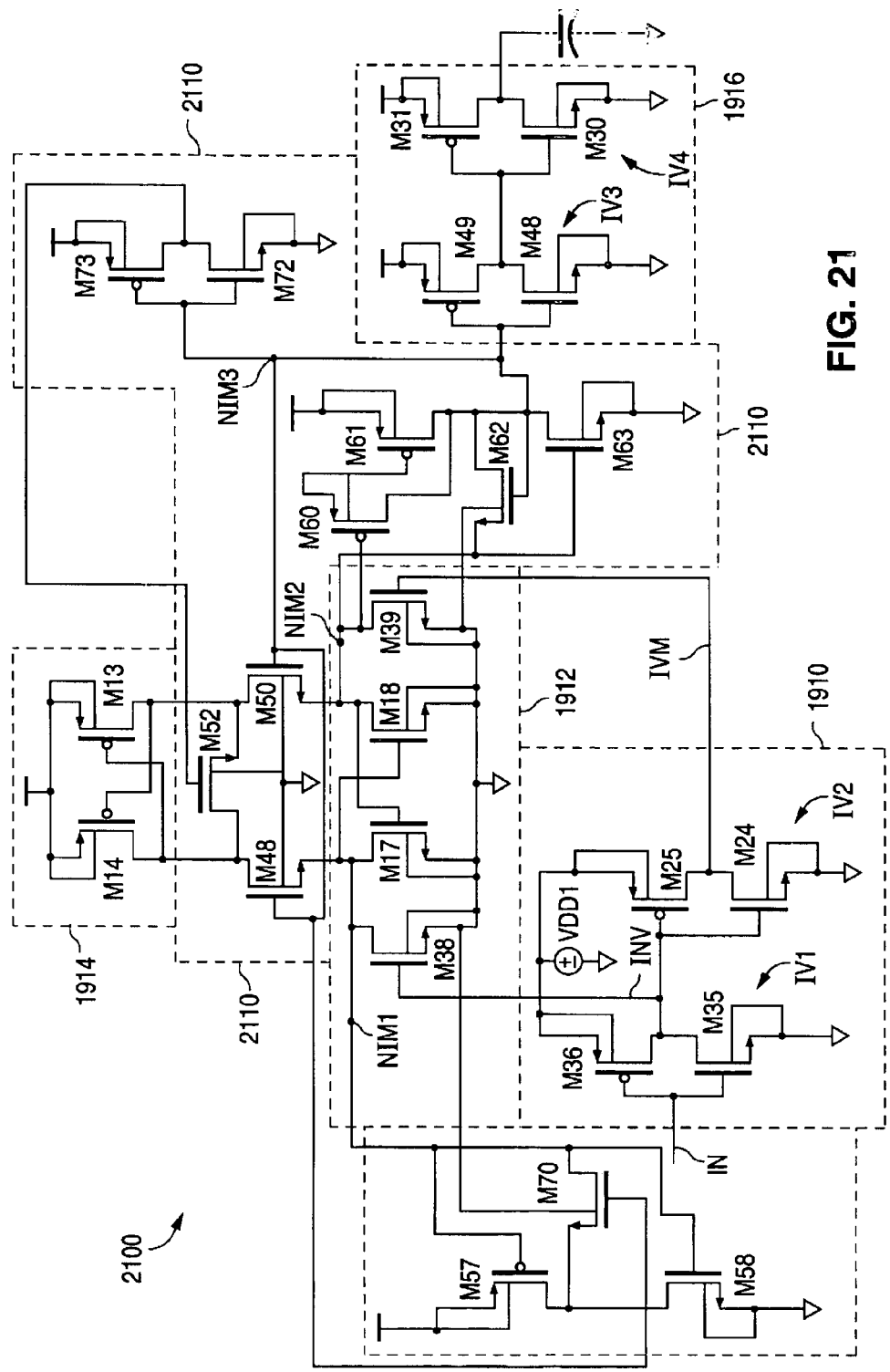
FIG. 21 is a circuit diagram illustrating an example of a level shifter 2100 in accordance with an alternate embodiment of the present invention.

FIG. 21 shows a circuit diagram that illustrates an example of a level shifter 2100 in accordance with an alternate embodiment of the present invention. Level shifter 2100 is similar to level shifter 1900 and, as a result, utilizes the same reference numerals to designate the structures which are common to both circuits.

As shown in FIG. 21, level shifter 2100 differs from level shifter 1900 in that level shifter 2100 includes a precharge stage 2110 that precharges the voltages on the inverters. Precharge stage 2110 includes a blocking circuit that includes NMOS transistors M48, M50, and M52, and an inverter IV6.

Transistor M48 has a source connected to the drain of transistor M14, a drain connected to the first intermediate node NIM1, and a gate connected to a third intermediate node NIM3. (Transistor M48 also has w=1 u, l=500 n, and m=1.) Transistor M50 has a source connected to the drain of transistor M13, a drain connected to the second intermediate node NIM2, and a gate connected to the third intermediate node NIM3. (Transistor M50 also has w=1 u, l=500 n, and m=1.) Transistor M52 has a source connected to the drain of transistor M13, a drain connected to the drain of transistor M14, and a gate. (Transistor M52 also has w=100 u, l=500 n, and m=1.)

Precharge stage 2110 also includes a sixth inverter IV6 that is connected to the block circuit. Inverter IV6 has a PMOS transistor M73 that has a source connected to the power supply VDD2, a drain connected to the gate of transistor M52, and a gate connected to the third intermediate node NIM3. (Transistor M73 also has w=2 u, l=500 n, and m=1.) In addition, sixth inverter IV6 also includes an NMOS transistor M72 that has a source connected to ground, a drain connected to the drain of PMOS transistor M73, and a gate connected to the third intermediate node NIM3. (Transistor M72 also has w=1 u, l=500 n, and m=1.)

Precharge stage 2110 also includes a first charging circuit that includes PMOS transistor M60, PMOS transistor M61, NMOS transistor M62, and NMOS transistor M62. PMOS transistor M60 has a source connected to the second voltage VCC2, a drain, and a gate connected to the second intermediate node NIM2. (Transistor M60 also has w=2 u, l=500 n, and m=1.) PMOS transistor M61 that has a source connected to the second voltage VCC2, a drain connected to the drain of transistor M60, and a gate connected to the source of transistor M60. (Transistor M61 also has w=2 u, l=500 n, and m=1.)

NMOS transistor M62 has a source connected to the gate of transistor M60, a drain connected to the drains of transistors M60 and M61, and a gate connected to the third intermediate node NIM3. (Transistor M62 also has w=5 u, l=500 n, and m=1.) NMOS transistor M63 that has a source connected to ground, a drain connected to the drains of transistors M60 and M61, and a gate connected to the gate of transistor M60. (Transistor M63 also has w=5 u, l=500 n, and m=1.)

As further shown in FIG. 21, precharge stage 2110 additionally includes a second charging circuit that includes PMOS transistor M57, NMOS transistor M70, and NMOS transistor M58. PMOS transistor M57 has a source connected to the second voltage VCC2, a drain, and a gate connected to the first intermediate node NIM1. (Transistor M57 also has w=2 u, l=500 n, and m=1.) NMOS transistor M70 has a source connected to the drain of transistor M57, a drain connected to the first intermediate node NIM1, and a gate connected to gate of transistor M62. (Transistor M70 also has w=5 u, l=500 n, and m=1.) NMOS transistor M58 that has a source connected to ground, a drain connected to the drain of transistor M57, and a gate connected to the first intermediate node NIM1. (Transistor M58 also has w=5 u, l=500 n, and m=1.)

In operation, when the input voltage IN is a logic high, transistor M39 turns on in response to the logic high of the non-inverted input signal IVM, and begins to pull down the voltage on the second intermediate node NIM2 to ground. Transistor M38, on the other hand, turns off in response to the logic low of the inverted input signal INV.

Since the gate of PMOS transistor M60 is also connected to the second intermediate node NIM2, the falling voltage turns on transistor M60. Transistor M60 pulls down the voltage on the gate of transistor M61, causing transistor M61 to turn on. When transistor M61 turns on, the voltage on the third intermediate node NIM3 rises. (The falling voltage on the second intermediate node NIM2 turns transistor M63 off.)

The rising voltage on the third intermediate node NIM3 turns on transistors M48 and M50. When transistor M50 turns on, the voltage on the gate of transistor M14 is pulled down, thereby turning on transistor M14. When transistor M14 turns on, the voltage on the first intermediate node NIM1 (via turned on transistor M48) begins to rise. The rising voltage on the first intermediate node NIM1 also turns on transistor M18 as described above.

The rising voltage on the first intermediate node NIM1 also turns off transistor M57, and turns on transistor M58. Since the gate of transistor M70 is connected to the third intermediate node NIM3, transistor M70 also turns on. When transistor M70 turns on, transistors M58 and M70 function as a voltage divider such that the drain of transistor M57 has a fractional value of the second source voltage VCC2. For example, the drain of transistor M57 can have a value equal to (½)VCC2.

The logic high on the third intermediate node NIM3 is also inverted by inverter IV6 which, in turn, turns off transistor M52. In addition, inverter IV3 inverts the logic high on the third intermediate node NIM3, and inverter IV4 inverts the output of inverter IV3 to drive a logic high at the level shifted voltage, e.g., 3.6 volts. Thus, level shifter 2100 in the FIG. 21 example is non-inverting.

On the other hand, when the input voltage IN transitions to a logic low, transistor M38 turns on in response to the logic high of the inverted input signal INV, and begins to pull down the voltage on the first intermediate node NIM1 to ground. Transistor M39, on the other hand, turns off in response to the logic low of the non-inverted input signal IVM.

When transistor M39 turns off, the voltage on the second intermediate node NIM2 quickly rises to a fractional value of the second source voltage VCC2 due to the voltage dividing action of transistors M62 and M63. For example, the voltage on the second intermediate node NIM2 can rise to a value equal to (½)VCC2.

As transistor M38 continues to pull down the voltage on the first intermediate node NIM1, transistor M13 turns on and begins to charge the voltage on the second intermediate node NIM2. Since transistors M62 and M63 have precharged the voltage on the second intermediate node NIM2, transistor M13 need only charge up from, for example, (½)VCC2.

As the second intermediate node NIM2 charges up, transistor M63 turns on and pulls down the voltage on the third intermediate node NIM3. As the voltage falls on the third intermediate node NIM3, transistors M48 and M50 turn off. Inverter IV6 inverts the logic low on the third intermediate node NIM3 to turn on transistor M52.

When transistor M52 turns on, the charge on the drain of transistor M13 is shared with the charge on the drain of transistor M14. As a result, the drains of transistors M13 and M14 each hold a potential of approximately (½)VCC2. The rising voltage on the second intermediate node NIM2 also turns on transistor M17 as described above. Further, the falling voltage on the first intermediate node NIM1 also turns on transistor M57 which, in turn, causes the voltage on the drain of transistor M57 to rise to the second voltage source VCC2.

When the input voltage IN again transitions to a logic high, transistor M39 turns on in response to the logic high of the non-inverted input signal IVM, and begins to pull down the voltage on the second intermediate node NIM2 to ground. Transistor M38, on the other hand, turns off in response to the logic low of the inverted input signal INV.

As noted above, when transistor M39 turns on, transistor M61 turns on which, in turn, causes the voltage on the third intermediate node NIM3 to rise. When the voltage on the third intermediate node NIM3 rises, transistor M48 and M50 to turn on, and transistor M70 turns on.

When transistor M48 turns on, the precharged voltage on the drain of transistor M14 (e.g., (½)VCC2), appears on the first intermediate node NIM1. In addition, when transistor M70 turns on, approximately ½ of the voltage on the drain of transistor M57 (e.g., (½)VCC2) appears on the first intermediate node NIM1 due to the action of transistors M58 and M70. As a result, transistor M14 need only charge up from approximately (½)VCC2.

By precharging the first and second intermediate nodes NIM1 and NIM2, the speed of level shifter 2100 can be increased. In addition, level shifter 2100 has non-overlapping phases.

Figure 22:
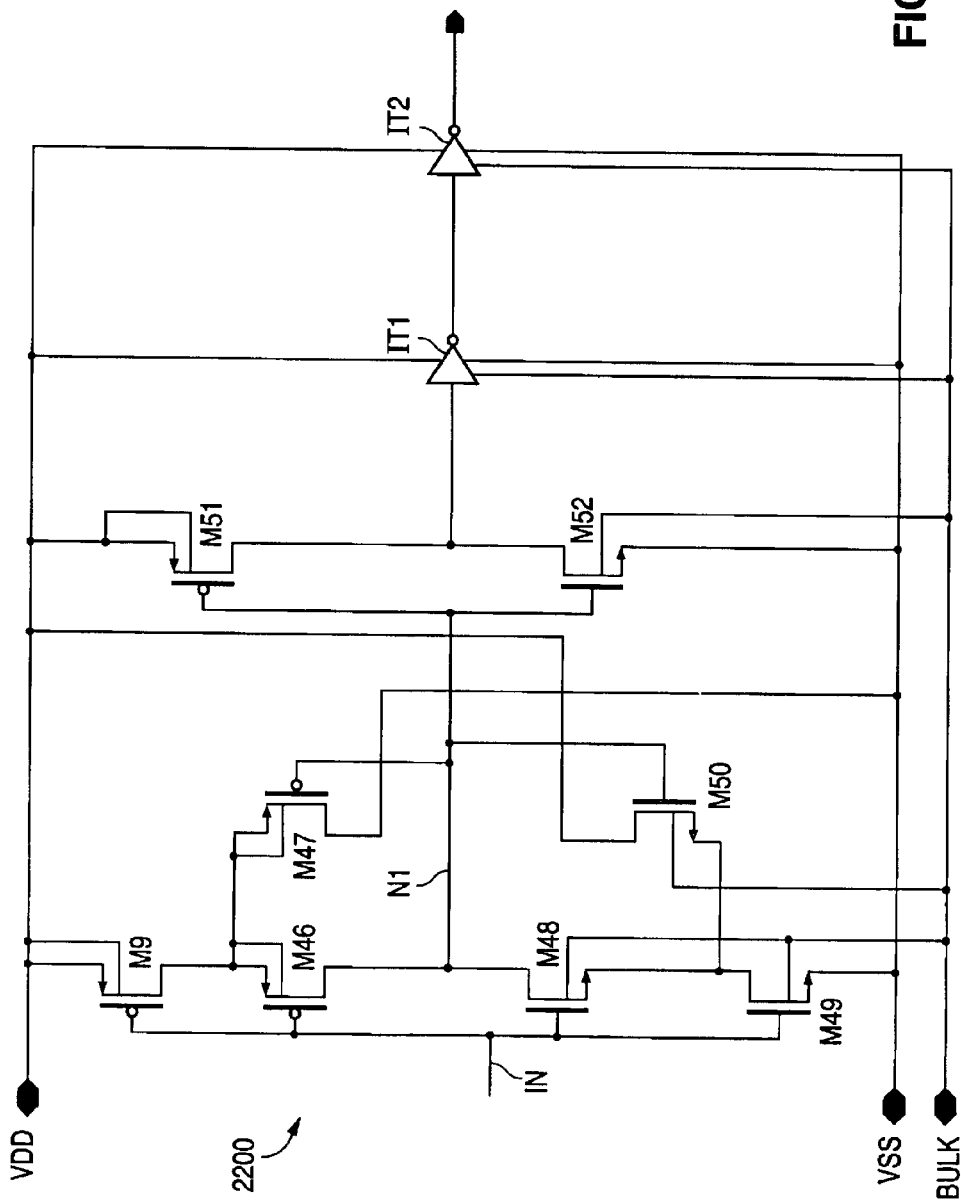
FIG. 22 is a circuit diagram illustrating a schmidt trigger circuit 2200 in accordance with an alternate embodiment of the present invention.

FIG. 22 shows a circuit diagram that illustrates a schmidt trigger circuit 2200 in accordance with an alternate embodiment of the present invention. As shown in FIG. 22, circuit 2200 includes PMOS transistors M9, M46 and M47. PMOS transistor M9 has a source connected to a power supply voltage VDD, a drain, a gate connected to receive an input signal IN, and an n-bulk connected to the power supply voltage VDD.

PMOS transistor M46 has a source connected to the drain of transistor M9, a drain connected to an output node N1, a gate connected to receive the input signal IN, and an n-bulk connected to the drain of transistor M9. PMOS transistor M47 has a source connected to the drain of transistor M9, a drain connected to ground, a gate connected to the output node N1, and an n-bulk connected to the drain of transistor M9.

As further shown in FIG. 22, circuit 2200 includes NMOS transistors M48, M49 and M50. NMOS transistor M48 has a source, a drain connected to the output node N1, a gate connected to receive the input signal IN, and a p-bulk connected to a p-bulk voltage PBULK such as ground. NMOS transistor M49 has a source connected to ground, a drain connected to the source of transistor M48, a gate connected to receive the input signal IN, and a p-bulk connected to a p-bulk voltage PBULK such as ground. NMOS transistor M50 has a source connected to the drain of transistor M49, a drain connected to the power supply voltage VDD, a gate connected to the output node N1, and an p-bulk connected to a p-bulk voltage PBULK such as ground.

In addition, circuit 2200 can additionally include an inverter that has transistors M51 and M52, an inverter IT1 connected to transistors M51 and M52, and an inverter IT2 connected to inverter IT1. PMOS transistor M51 has a source connected to the power supply voltage VDD, a drain connected to inverter IT1, a gate connected to the output node N1, and an n-bulk connected to the power supply voltage VDD. NMOS transistor M52 has a source connected to ground, a drain connected to inverter IT1, a gate connected to the output node N1, and an p-bulk connected to a p-bulk voltage PBULK such as ground. (The n-bulks of the PMOS transistors can be separately connected to an n-bulk voltage, such as a voltage equal to the power supply voltage VDD.)

In operation, when the input signal IN is a logic low, PMOS transistors M9 and M46, and NMOS transistor M50 are turned on, while NMOS transistors M48 and M49, and PMOS transistor M47 are turned off. Transistors M9 and M46 source current to, and charge up the voltage on, the output node N1. The rising voltage on the output node N1, in turn, turns on transistor M50.

When the input signal IN changes logic states and begins to rise, transistor M49 turns on and, since transistor M50 is already on, sinks a current through transistor M50. Sinking a current through transistor M50 delays the turn on of transistor M48. Delaying the turn on of transistor M48, in turn, reduces the amount of time that transistors M9, M46, M48, and M49 are on at the same time, thereby reducing the shoot through current.

When the input signal IN is a logic high, PMOS transistors M9 and M46, and NMOS transistor M50 are turned off, while NMOS transistors M48 and M49, and PMOS transistor M47 are turned on. Transistors M48 and M49 sink current from, and pull down the voltage on, the output node N1. The falling voltage on the output node N1, in turn, turns on transistor M47.

When the input signal IN changes logic states and begins to fall, transistor M9 turns on and, since transistor M47 is already on, sources a current through transistor M47. Sourcing a current through transistor M47 delays the turn on of transistor M46. Delaying the turn on of transistor M46, in turn, reduces the amount of time that transistors M9, M46, M48, and M49 are on at the same time, thereby reducing the shoot through current. A schmidt trigger circuit 2200 can be used in lieu of an inverter.

Referring again to FIG. 2, power supply system 200 also includes an LC filter 226 that generates a DC voltage on the power node PN. LC filter 226 includes an inductor L that is connected to driver 224 and the power node PN, and a capacitor C that is connected to the power node PN and ground. In the example shown in FIG. 2, inductor L has a value of 5 uH and capacitor C has a value of 5 uC. In addition, approximately 1.8V are generated on the power node PN (with a small ripple).

In accordance with the present invention, the power node PN is connected to, and provides a supply voltage to, a digital circuit DC, such as a microprocessor or memory. In addition, the power node PN is connected to the elements of power system 200, with the exception of level shifter and high voltage driver 224 (FIG. 2 only shows the power node PN connected to propagation delay detector 212 for clarity).

Thus, in summary, the rising edge of the input clock signal ICLK propagates through a number of delay blocks DL before the rising edge of the sample clock signal SCLK latches the outputs of the delay blocks DL in the corresponding taps TS. The latched value is decoded to define a 5-bit encoded word ENC, which is used by up/down counter 220 to generate a 5-bit word BW that controls the width of the pulse. The width of the pulse, in turn, defines the voltage that is generated on the power node PN.

When the voltage on the power node PN is less than or greater than the desired voltage, an offset is added via select word SW(4:0). The value of the select word SW(4:0) is defined so that no offset is equal to a predefined value, such as 10000. In this case, one offset in the positive direction produces 10001, and one offset in the negative direction produces 01111.

The offset defined by the select word SW(4:0) is combined with the encoded word ENC by adder/subtractor 216 to, for example, increase the modified word MW by one. Up/down counter 220 responds to the changed modified word MW and changes the word BW to change the width of the pulse. The changed pulse width then changes (increases or decreases) the voltage that is generated on the power node PN.

As further shown in FIG. 2, power supply system 200 can include an over voltage tap selector 230 that is connected to a number of taps TS. In addition, tap selector 230 utilizes the select word SW(4:0) to select one of the taps TS0–TS32 to be the over voltage tap TS that defines the over voltage tap signal TOV.

During normal operation, the rising edge of the input clock signal ICLK propagates through a number of delay blocks DL before the rising edge of the sample clock signal SCLK latches the outputs of the delay blocks DL in the corresponding taps TS. However, during start up operation, the oscillating or ringing voltage that results from the second order response of the LC network to a step function momentarily increases the voltage and causes the rising edge of the input clock signal ICLK to propagate through more delay blocks DL than during normal operation.

For example, assume that during normal operation, the first 16 taps TS0–TS15 latch a logic high, while the remaining 17 taps TS16–TS32 latch a logic low. If the 17$^{th}$ tap TS16 is then selected to be the over voltage tap TS, then the over voltage tap outputs a logic low during normal operation. During start up operation, the momentarily increased voltage from the oscillating voltage causes the delay blocks DL to operate faster and, therefore, have less delay.

As a result, the rising edge of the input clock signal ICLK propagates further, causing the 17$^{th}$ tap TS16 to latch a logic high. Thus, the over voltage tap TS outputs a over voltage tap signal TX16 with a logic low during normal operation, and with a logic high when the supply voltage VCC on the power node PN increases enough to reduce the propagation delay so that the 17$^{th}$ tap TS16 latches a logic high.

When the select word SW(4:0) has value of 10000 that selects the 17$^{th}$ tap TS16 as the over voltage tap, then when the select word SW(4:0) is increased by one, the 18$^{th}$ tap TS17 is selected as the over voltage tap. Similarly, when the select word SW(4:0) is decreased by one, the 16$^{th}$ tap TS15 is selected as the over voltage tap.

As further shown in FIG. 2, power supply system 200 can include a finite state machine 232 that outputs a clear signal during start up that limits the energy that is initially input to LC filter 226 to limit overshoot. In addition, state machine 232 receives the load signals load one LD1, load two LD2, and load three LD3, and the flip signal FL. State machine 232 further receives the output from the first tap TX0, and a fast clock signal FST. State machine 232 additionally receives the up and down signals UP and DN, and outputs the timed up and down signals UP1 and DN1, respectively.

Figure 23:
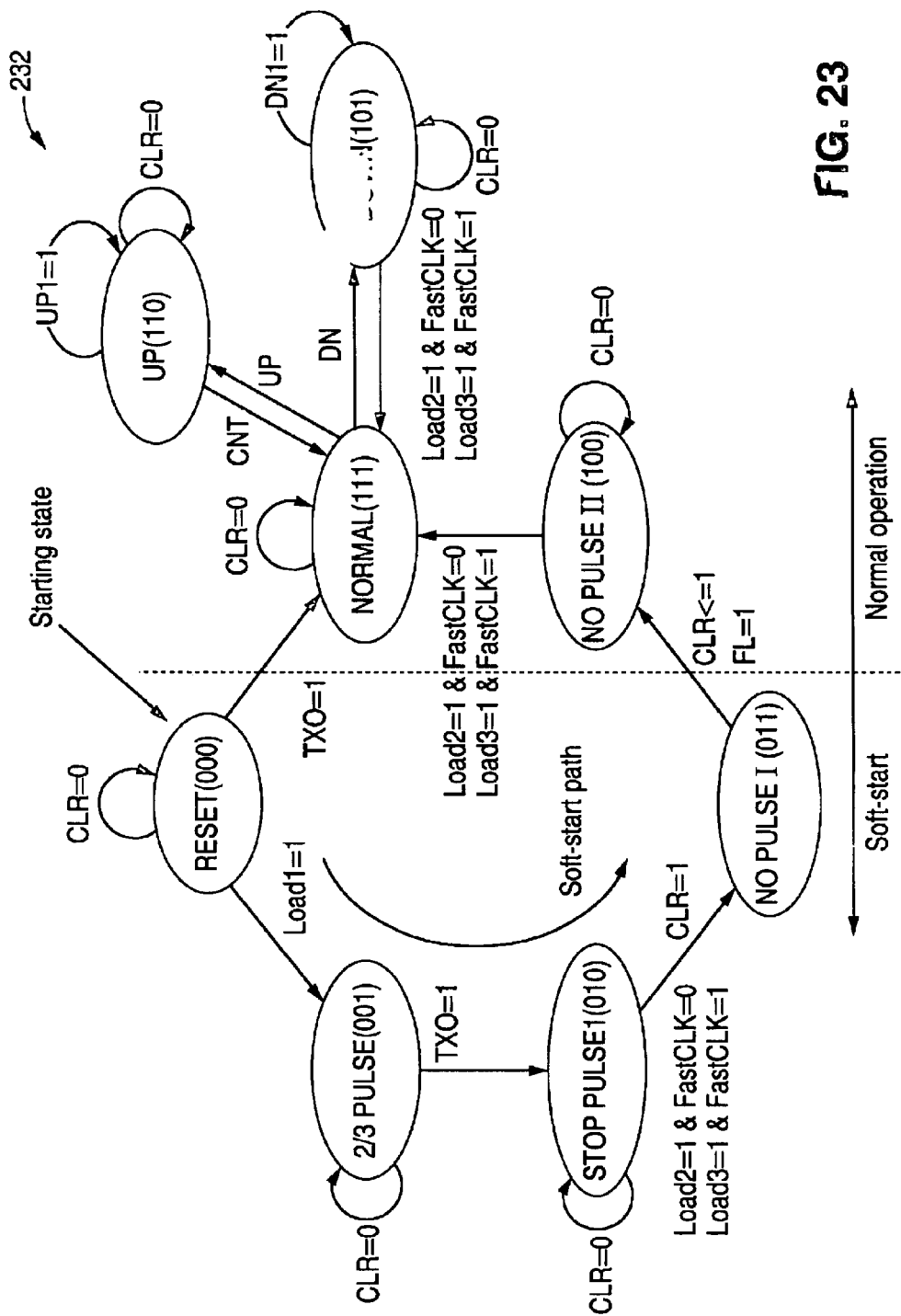
FIG. 23 is a state machine diagram illustrating the operation of state machine 232 in accordance with the present invention.

FIG. 23 shows a state machine diagram that illustrates the operation of state machine 232 in accordance with the present invention. As shown in FIG. 23, state machine 232 begins in state 000 and waits until the load one pulse LD1 is detected, or the first tap TS0 latches a logic high. During start up, there is essentially no supply voltage VCC on the power node PN.

As a result, tap TS0 and the remaining taps are unable to latch the input clock signal ICLK and output a logic high. Thus, during start up, taps TS0–TS32 output signals TX0–TX32 with logic zeros, and state machine 232 moves from state 000 to state 001 when the load one pulse LD1 is detected.

In state 001, the logic zeros output by taps TS0–TS32 are decoded by frequency detector 214 such that the encoded word ENC(4:0) causes the pulse modulated signal PWM to have a logic high that is twice as long as a subsequent logic low. This increases the acceleration of the supply voltage VCC on the power node PN, preventing the supply voltage VCC from diverging in a low direction.

When the supply voltage VCC on the power node PN rises such that the first tap TS0 can latch and output the signal TX0 as a logic high, state machine 232 moves to state 010. Alternately, a derivative controller can be used to move to state 010 when the rate of change of the supply voltage VCC is greater than a predefined amount.

In state 010, state machine 232 outputs a clear signal CLR to counter 220. The clear signal CLR causes counter 220 to output all zeros which, in turn, causes NOR gate G1 (FIG. 7) to output the signal as a logic high and NOR bar signal as a logic low.

As shown in FIGS. 9A–9M, when the G1 signal is high, the pulse modulated signal PMS is held low as long as the flip signal FL is low. The pulse modulated signal PMS is held low during the positive transition of the oscillation or ringing, thereby reducing the effect of the oscillation.

When the second load signal LD2 and the clear signal CLR are asserted and the fast clock signal FCLK is low, or the third load signal LD3 and the fast clock signal FCLK are asserted, state machine 232 moves to state 011. (The second and third load signals LD2 and LD3 are output every 2.56 uS as long as the flip signal FL is low.)

State machine 232 remains in state 011 until the flip signal FL and the clear signal CLR are asserted. At that point, state machine 232 moves to state 100, where state machine 232 de-asserts the clear signal CLR. The change in the flip signal FL causes the pulse width modulated signal PMS to reverse.

Derivative control theory explains that a normal pulse width modulated signal provides an output which is the average of the high and low periods. During start up, the time spent low should be greater than the time spent high since the LC network will resonate in response to a step function. The ringing or overshoot must be counteracted by varying the high and low periods of the pulse width modulated signal PMS to coincide with the low and high periods of the oscillation.

Returning to FIG. 23, when the second load signal LD2 is asserted and the fast clock signal FCLK is low, or the third load signal LD3 and the fast clock signal FCLK are asserted, state machine 232 moves to state 111. (The second and third load signals LD2 and LD3 are output every 2.56 uS only when the flip signal FL is low.)

Alternately, when in state 000, if a battery back up or other voltage source is present providing a supply voltage VCC while system 100 is powered down, the signal from the first tap TX0 is a logic high at start up, causing state machine 232 to move from state 000 to state 111. When in state 111, system 100 operates normally.

Thus, state machine 232 provides a soft start function that provides an inverse impulse response that quickly dampens out the oscillation or ringing that results with start up or load transients. In addition, state machine 232 also responds to changing PVT conditions, and tracks a slowly changing clock in either direction.

As shown in FIG. 23, when changing PVT conditions alter the operational speed of propagation delay detector 212, state machine 232 detects the change, which is a change in the 1-0 transition output by the propagation delay word PDW. State machine 232 moves to state 110 when the propagation delay word PDW indicates that changing system clock frequency has reduced the delay, and therefore increased the speed of detector 212. When in state 110, the count is adjusted by counter 220 using the timed up signal UP1 to change the pulse width which, in turn, adjusts the supply voltage VCC. (The count can only change at pre-defined points.)

State machine 232 also moves to state 101 when the propagation delay word PDW indicates that changing PVT conditions have increased the delay, and therefore reduced the speed of detector 212. When in state 101, the count is adjusted by counter 220 using the timed down signal DN1 to change the pulse width which, in turn, adjusts the supply voltage VCC.

Thus, an all digital power supply system and method has been described in accordance with the present invention. The system measures the propagation delay of a first clock signal when clocked by a second clock signal, and utilizes the measured delay to select an encoded data word. The encoded data word is used to set the width of a pulse width modulated signal that is output to a LC network that averages out the pulses to form a DC supply voltage.

One advantage of the present invention is that the present invention eliminates the need for a band gap reference voltage source by providing enough voltage to run the digital circuits as fast as needed. As a result, there is no need to have a fixed supply voltage that is referenced to a band gap reference voltage, thereby eliminating the need for a band gap reference voltage source.

Another advantage of the present invention is that the present invention eliminates the need for a PID. The present invention utilizes a state machine to vary the pulse width modulated signal to counteract start up and load transients that introduce oscillations into the supply voltage. By utilizing the state machine, oscillations are dampened out quickly, thereby eliminating the need for a PID.

It should be understood that the above descriptions are examples of the present invention, and various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A power supply system comprising:
   a first clock generator that outputs an input clock signal and a sample clock signal;
   a power node;
   a propagation delay detector connected to the power node that detects a propagation delay of the input clock signal as clocked by the sample clock signal, and outputs a multi-bit propagation delay word that identifies the propagation delay;
   a frequency detector connected to the propagation delay detector that receives the propagation delay word from the propagation detector, and generates a multi-bit encoded word that represents the propagation delay word;
   a second clock generator that outputs a load signal in response to a reference clock signal;
   a counter that loads the encoded word in response to the load signal, changing a binary value of the encoded word as a count in response to the reference clock signal, and outputting the binary value of the count as a binary word;
   a pulse width modulator connected to the counter that outputs a pulse modulated signal where a width of a pulse is defined by the binary value of the binary word output from the counter;
   a level shifter and driver connected to the pulse width modulator that level shifts and drives the pulse modulated signal; and
   an LC filter connected to the level shifter and driver that generates a DC supply voltage on the power node in response to the pulse modulated signal.

2. The power supply of claim 1 wherein sample clock signal is a quadrature signal with respect to the input clock signal.

3. The power supply of claim 1 wherein the propagation delay detector includes:
   a series of substantially equal delay blocks that have a corresponding series of outputs; and
   a series of taps that latch and output the logic states and the inverse logic states that are present on selected outputs of the delay blocks in response to the sample clock signal.

4. The power supply of claim 1 wherein the LC filter includes an inductor that is connected to the level shifter and driver and the power node, and a capacitor that is connected to the power node and ground.

5. The power supply of claim 4 wherein the power node is connected to the frequency detector, the counter, the pulse width generator, and a digital circuit.

6. The power supply of claim 1 and further comprising a combiner that combines a multi-bit select word to the encoded word to output a modified encoded word, the counter receiving the modified encoded word in lieu of the encoded word.

7. The power supply of claim 6 wherein the combiner is an adder/subtractor.

8. The power supply of claim 1 and further comprising an over voltage tap selector connected to the propagation delay detector and to receive a select word that selects a bit of the propagation delay word to be an over voltage bit that defines a logic state of an over voltage tap signal, the second clock generator outputting a flip signal with a logic state defined by a logic state of the over voltage tap signal, the counter counting in a first direction when the flip signal is in a first logic state, and counting in an opposite second direction when the flip signal is in a second logic state.

9. The power supply of claim 6 and further comprising an over voltage tap selector connected to the propagation delay detector and to receive the select word, the select word selecting a bit of the propagation delay word to be an over voltage bit output by the tap selector that defines a logic state of an over voltage tap signal, the second clock generator outputting a flip signal with a logic state defined by a logic state of the over voltage tap signal, the counter counting in a first direction when the flip signal is in a first logic state, and counting in an opposite second direction when the flip signal is in a second logic state.

10. The power supply of claim 8 the second clock generator outputs a first load signal of the plurality of load signals regardless of a logic state of the flip signal, and a second load signal of the plurality of load signals only when the second load signal is in a first logic state.

11. The power supply of claim 3 wherein when the rising edge of the input clock signal is input to a first delay block of the series, the input clock signal propagates through each succeeding delay block in the series until a rising edge of the sample clock signal clocks each of the taps and resets each of the delay blocks.

12. The power supply of claim 3 wherein the frequency detector includes:
   a logic block that receives the propagation delay word and outputs a multi-bit intermediate word, the intermediate word being shorter than the propagation delay word; and
   a logic encoder connected to the logic block that encodes the intermediate word to output the encoded word, the encoded word being shorter than the intermediate word.

13. The power supply of claim 3 wherein the series of delay blocks and the series of taps are unequal.

14. The power supply of claim 1 and further comprising a state machine, the state machine outputting a clear signal to the counter during a start up operation to blank the pulse modulated signal.

15. The power supply of claim 1 wherein the sample clock signal and the reference clock signal are equal.

16. The power supply of claim 1 and further comprising a digital circuit that is connected to the power node, the digital circuit drawing current from the power node.

17. The power supply of claim 16 wherein the digital circuit is a processor.

18. A method of providing power, the method comprising the steps of:
   outputting an input clock signal and a sample clock signal;
   detecting a propagation delay of the input clock signal as clocked by the sample clock signal, and outputting a multi-bit propagation delay word that identifies the propagation delay;

generating a multi-bit encoded word that represents the propagation delay word in response to the propagation delay word;

outputting a plurality of load signals in response to a reference clock signal;

loading the encoded word in response to a load signal, changing a binary value of the encoded word as a count in response to the reference clock signal, and outputting the binary value of the count as a binary word;

outputting a pulse modulated signal where a width of a pulse is defined by the binary value of the binary word; and generating a DC supply voltage on a power node in response to the pulse modulated signal.

19. The method of claim 18 wherein sample clock signal is a quadrature signal with respect to the input clock signal.

20. The method of claim 19 wherein a digital circuit is connected to the power node, and draws current from the power node.

21. A power supply system comprising:

a clock generator that outputs an input clock signal and a sample clock signal;

a detector connected to the clock generator and a power node, the detector including a plurality of delay blocks, receiving the input clock signal and the sample clock signal, and outputting a multi-bit word that represents a number of delay blocks that an edge of the input clock signal passed through before an edge of the sample clock signal was detected;

a signal generator that outputs a load signal in response to the sample clock signal; and a counter that loads the multi-bit word as a count in response to the load signal, changes a binary value of the count in response to the sample clock signal, and outputs the binary value of the count as a binary word.

22. The power supply system of claim 21 and further comprising a pulse width modulator connected to the counter that outputs a pulse modulated signal where a width of a pulse is defined by the binary value of the binary word output from the counter.

23. The power supply system of claim 22 and further comprising a level shifter and driver connected to the pulse width modulator that level shifts and drives the pulse modulated signal to output a level shifted pulse modulated signal.

24. The power supply system of claim 23 and further comprising an LC filter connected to the level shifter and driver that generates a DC supply voltage on the power node in response to the level shifted pulse modulated signal.

25. The power supply of claim 24 wherein the LC filter includes an inductor that is connected between the power node and the level shifter and driver, and a capacitor that is connected between the power node and ground.

26. The power supply of claim 25 wherein the power node is connected to the frequency detector, the counter, the pulse width generator, and a digital circuit.

27. The power supply of claim 26 and further comprising a digital circuit that is connected to the power node, the digital circuit drawing current from the power node.

28. The power supply system of claim 21 wherein the detector includes:

a propagation delay detector connected to the clock generator that outputs a propagation word that indicates the number of delay blocks that the edge of the input clock signal passed through before the edge of the sample clock signal was detected; and a frequency detector connected to the propagation delay detector that receives the propagation word, and outputs the multi-bit word in response, the multi-bit word having fewer bits than the propagation word.

\* \* \* \* \*

UNITED STATES PATENT AND TRADEMARK OFFICE
CERTIFICATE OF CORRECTION

PATENT NO. : 6,870,410 B1
DATED : March 22, 2005
INVENTOR(S) : Doyle et al.

Page 1 of 1

It is certified that error appears in the above-identified patent and that said Letters Patent is hereby corrected as shown below:

<u>Title page,</u>
Item [56], References Cited, OTHER PUBLICATIONS, "Dragan Maksimovic and Sandeep Dhar," reference, delete "10/053,828" and replace with -- 10/053,858 --.
"Dragan Maksimovic, Ravindra Ambatipudi, Sandeep Dhar and Bruno Krazen" reference, delete "Krazen" and replace with -- Kranzen --.
"James T. Doyle and Dragan Maksimovic" reference, delete "10/160,428" and replace with -- 10/106,428 --.
"Intel Xscale Core," reference, delete "retrived" and replace with -- retrieved --.
"John G. Maneatis," reference, delete "PII" and replace with -- PLL --.

Signed and Sealed this

Seventeenth Day of May, 2005

JON W. DUDAS
*Director of the United States Patent and Trademark Office*